United States Patent
Kurokawa et al.

(10) Patent No.: US 7,214,558 B2
(45) Date of Patent: May 8, 2007

(54) METHOD FOR FORMING PATTERNS ON A SEMICONDUCTOR DEVICE USING A LIFT OFF TECHNIQUE

(75) Inventors: Atsushi Kurokawa, Takasaki (JP); Hiroshi Inagawa, Maebashi (JP); Toshiaki Kitahara, Misato (JP); Yoshinori Imamura, Sagamiko (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/257,060

(22) Filed: Oct. 25, 2005

(65) Prior Publication Data

US 2006/0032762 A1    Feb. 16, 2006

Related U.S. Application Data

(63) Continuation of application No. 10/809,525, filed on Mar. 26, 2004, now Pat. No. 7,029,938.

(30) Foreign Application Priority Data

Mar. 26, 2003    (JP) .............................. 2003-084220

(51) Int. Cl.
*H01L 21/00* (2006.01)
*H01L 21/8235* (2006.01)

(52) U.S. Cl. .......................... 438/46; 438/47; 438/204

(58) Field of Classification Search ............ 438/46–48, 438/204–205
See application file for complete search history.

(56) References Cited

U.S. PATENT DOCUMENTS

2001/0010388 A1    8/2001    Yanagihara et al.

2003/0218185 A1    11/2003    Ohbu et al.

FOREIGN PATENT DOCUMENTS

| JP | 2000-277530 | 10/2000 |
|---|---|---|
| JP | 2001-189319 | 7/2001 |
| JP | 2002-246587 | 8/2002 |

*Primary Examiner*—Cuong Nguyen
(74) *Attorney, Agent, or Firm*—Antonelli, Terry, Stout & Kraus, LLP.

(57) ABSTRACT

Provided is a technique of improving the properties of a bipolar transistor. Described specifically, upon formation of a collector electrode around a base mesa by the lift-off method, a resist film is formed over connection portions between the outer periphery of a region OA1 and a region in which the base mesa 4a is formed, followed by successive formation of gold germanium (AuGe), nickel (Ni) and Au in the order of mention over the entire surface of a substrate so that the stacked film of them will not become an isolated pattern. As a result, the stacked film over the base mesa 4a is connected to a stacked film at the outer periphery of the region OA1, facilitating peeling of the stacked film over the base mesa 4a. In addition, generation of side etching upon formation of a via hole extending from the back side of the substrate to a backside via electrode is reduced by forming the backside via electrode using a material such as WSi which hardly reacts with an n type GaAs layer or n type InGaAs layer.

8 Claims, 26 Drawing Sheets

4a(BMA)

4a(BMA)

METHOD FOR FORMING PATTERNS ON A SEMICONDUCTOR DEVICE USING A LIFT OFF TECHNIQUE

CROSS-REFERENCE TO RELATED APPLICATION

The present application is a Continuation application of parent U.S. application Ser. No. 10/809,525, filed Mar. 26, 2004 now U.S. Pat. No. 7,029,938, which claims priority from Japanese patent application JP 2003-084220, filed on Mar. 26, 2003, the content of which is hereby incorporated by reference into this application.

BACKGROUND OF THE INVENTION

The present invention relates to a semiconductor device and to a method of manufacture thereof; and, more particularly, the invention relates to a technique that is effective when applied to a semiconductor device which is formed by a method having a step of forming patterns by the so-called liftoff method.

There are, for example, semiconductor devices using a Group III-V compound of the periodic table, such as gallium arsenide (GaAs). Such compound semiconductors are characterized by the fact that they exhibit a greater mobility than Si (silicon), which enables preparation of semi-insulating crystals and liquid crystals, and a heterojunction can be formed by using them.

For example, a hetero-junction bipolar transistor (HBT) using gallium arsenide is formed as a bipolar transistor using GaAs as a base layer and a heterogeneous semiconductor, such as InGaP (indium gallium phosphide) or AlGaAs (aluminum gallium arsenide), as an emitter layer. It is possible to increase the a current amplification ratio and thereby improve the properties of a transistor by using a heterojunction (heterogeneous junction) to increase the forbidden band width of the emitter over that of the base in an emitter-base junction.

For example, Japanese Patent Application Laid-Open No. 2001-1898319 ([0034], FIG. 4) describes an HBT using GaAs as a base layer and InGaP as an emitter layer. In this device, the emitter contact layer (16) is formed as a substantially annular structure. In addition, the emitter electrode (17) is designed so that wiring does not need to cross over the emitter electrode (17) upon formation of an extraction interconnect of the base electrode (19).

Japanese Patent Application Laid-Open No. 2002-246587 ([0041], FIG. 17) discloses a GaAs type HBT whose base layer (3) and an emitter layer (4) have a circular planar shape.

Japanese Patent Application Laid-Open No. 2000-277530 (Summary, FIG. 1) discloses a GaAs type HBT. It has, on the back side of its substrate, a via hole and a metal film that is adhered on the back side of the substrate.

SUMMARY OF THE INVENTION

The present inventors have carried out an investigation of an HBT using GaAs. They have studied and developed an HBT, for example, using n type GaAs for a collector region, p type GaAs for a base region and n type InGaP for an emitter region.

Over these regions, electrodes (interconnects) for the extraction of these regions are formed. Such electrodes are sometimes formed by etching, but when gold (Au) is used as an electrode, patterns are formed by the lift-off method because Au is a material which cannot be processed (etched) easily. There are not very many gases or liquids that are usable for chemical etching of some metals, such as Au, while for such metals, a sufficient etching selectivity to an underlying layer cannot be secured, which makes physical etching of such a metal difficult.

The lift-off method is a method of forming a photoresist film in a region other than a region in which the patterns are to be formed, forming a desired film over the entire surface, and removing the photoresist film and at the same time, removing the film lying thereover to leave only the patterns in the region. This method enables processing of metals for which there are no suitable etchants (etching gases) or those for which sufficient etching selectivity to an underlying film cannot be secured.

As a result of investigation, however, the present inventors have found a problem in that the film to be removed remains and desired patterns cannot be formed. This problem will be described later more specifically with reference to FIGS. 24 and 25.

In an HBT of the type investigated by the present inventors, an emitter extraction electrode is electrically connected to a back electrode of a semiconductor substrate. Upon electrical connection, in order to minimize the inductance component of the emitter extraction electrode, via holes reaching the emitter extraction electrode are formed from the backside of the semiconductor substrate, and then, an electrode is formed on the backside of the semiconductor substrate including the via holes.

The present inventors have found, however, that side etching occurs upon formation of the via holes. On the etched side portions, back electrodes are hardly formed and voids (hollows or gaps) appear. This deteriorates the adhesion of the back electrode, becoming a cause of peeling.

In addition, when side etching appears, the back electrode at this place becomes thin and disconnection tends to occur. Even if disconnection does not occur, the wiring resistance rises or the electromigration resistance lowers, leading to a deterioration in the reliability of the back electrode.

An object of the present invention is to provide a technique for improving the properties of a bipolar transistor.

The above-described and the other objects, and novel features of the present invention will be apparent from the description herein and the accompanying drawings.

Of the embodiments and features disclosed in the present application, representative examples will next be summarized briefly.

A method of manufacture of a semiconductor device according to the invention comprises the step of: (a) forming a pattern in a second region encompassing therewith a first region over a semiconductor substrate, the step (a) including the steps of: (b) forming a first film over the first region, a third region encompassing therewith the second region and first and second connection portions for connecting the first region and the third region; (c) after the step (b), forming a second film over the semiconductor substrate; and (d) after the step (c), removing the first film to remove the second film over the first region, the third region and the first and second connection portions and thereby forming two patterns made of the second film over the second region.

A semiconductor device according to the present invention comprises: (a) a semiconductor substrate having a first region, a second region encompassing the first region therewith, and a third region encompassing the second region therewith; (b) a collector layer formed in the first region and the second region; (c) a base layer formed in the first region over the collector layer; (d) an emitter layer formed over the base layer; and (e) a collector electrode formed in the second region over the collector layer and having a first portion and a second portion separated from each other by two cutout portions.

A semiconductor device according to the present invention comprises: (a) a substrate having a first main surface and a second main surface opposite thereto; (b) a compound semiconductor layer formed over the first main surface; (c) a first conductive film formed over the compound semiconductor layer; (d) an opening portion extending from the second main surface and reaching the first conductive film; and (e) a second conductive film formed over the second main surface and in the opening portion, wherein the first conductive film is made of a refractory metal or a nitride or silicide of a refractory metal.

A method of manufacture of a semiconductor device according to the present invention comprises the steps of: (a) preparing a substrate having a first main surface and a second main surface opposite thereto; (b) forming a compound semiconductor layer over the first main surface; (c) forming, over the compound semiconductor layer, a first conductive film made of a refractory metal, or a nitride or silicide thereof; (d) forming an opening portion extending from the second main surface and reaching the first conductive film; and (e) forming a second conductive film over the second main surface and in the opening portion.

DETAILED DESCRIPTION OF THE PREFERRED EMBODIMENTS

Figure 1:
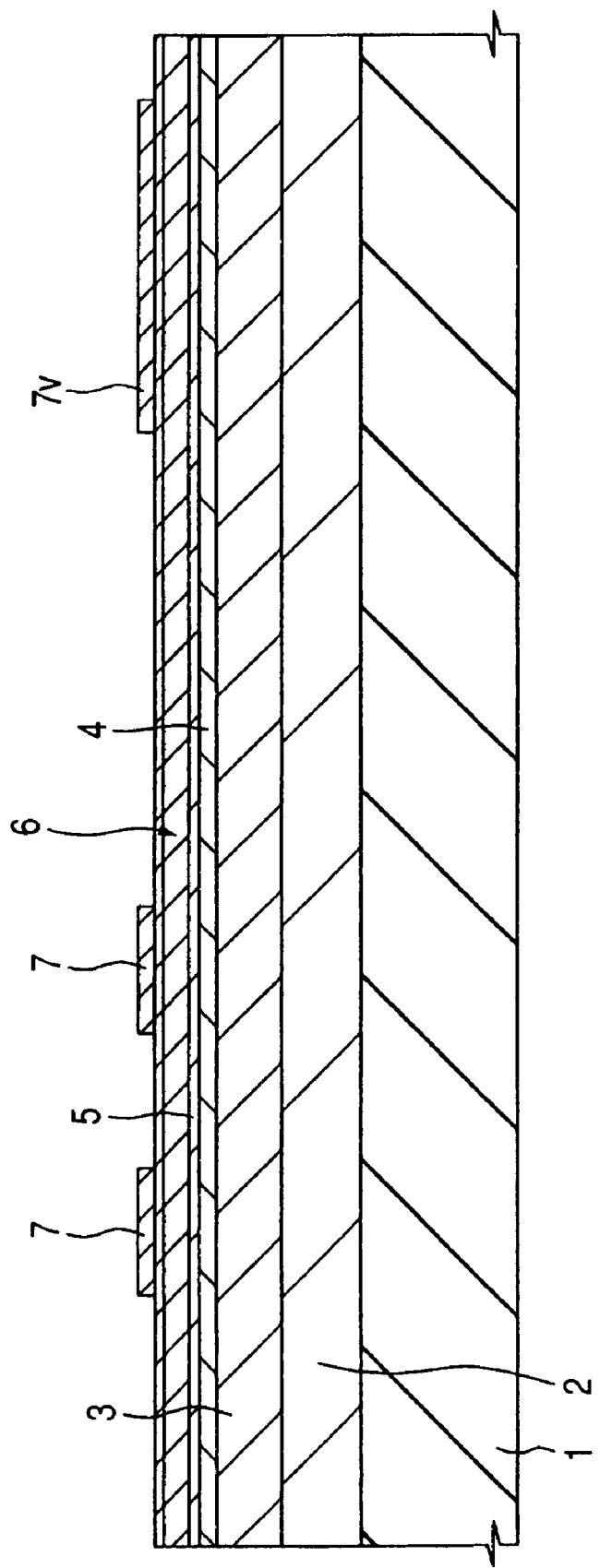
FIG. 1 is a fragmentary cross-sectional view of a substrate illustrating a manufacturing method of a semiconductor device (HBT) according to one embodiment of the present invention.

An embodiment of the present invention will be described hereinafter based on the accompanying drawings. In all of the drawings, elements having a like function will be identified by like reference numerals and overlapping descriptions thereof will be omitted.

The structure and steps in the manufacture of the semiconductor device (HBT) according to this embodiment will be described with reference to FIGS. 1 to 22, which are fragmentary cross-sectional or fragmentary plan views illustrating the method of manufacture of the semiconductor device of this embodiment.

First, the structure of the semiconductor device (HBT) of this embodiment will be described. The structure will become more apparent from the later description of the manufacturing method, so that only the characteristic structure will be explained here.

Figure 14:
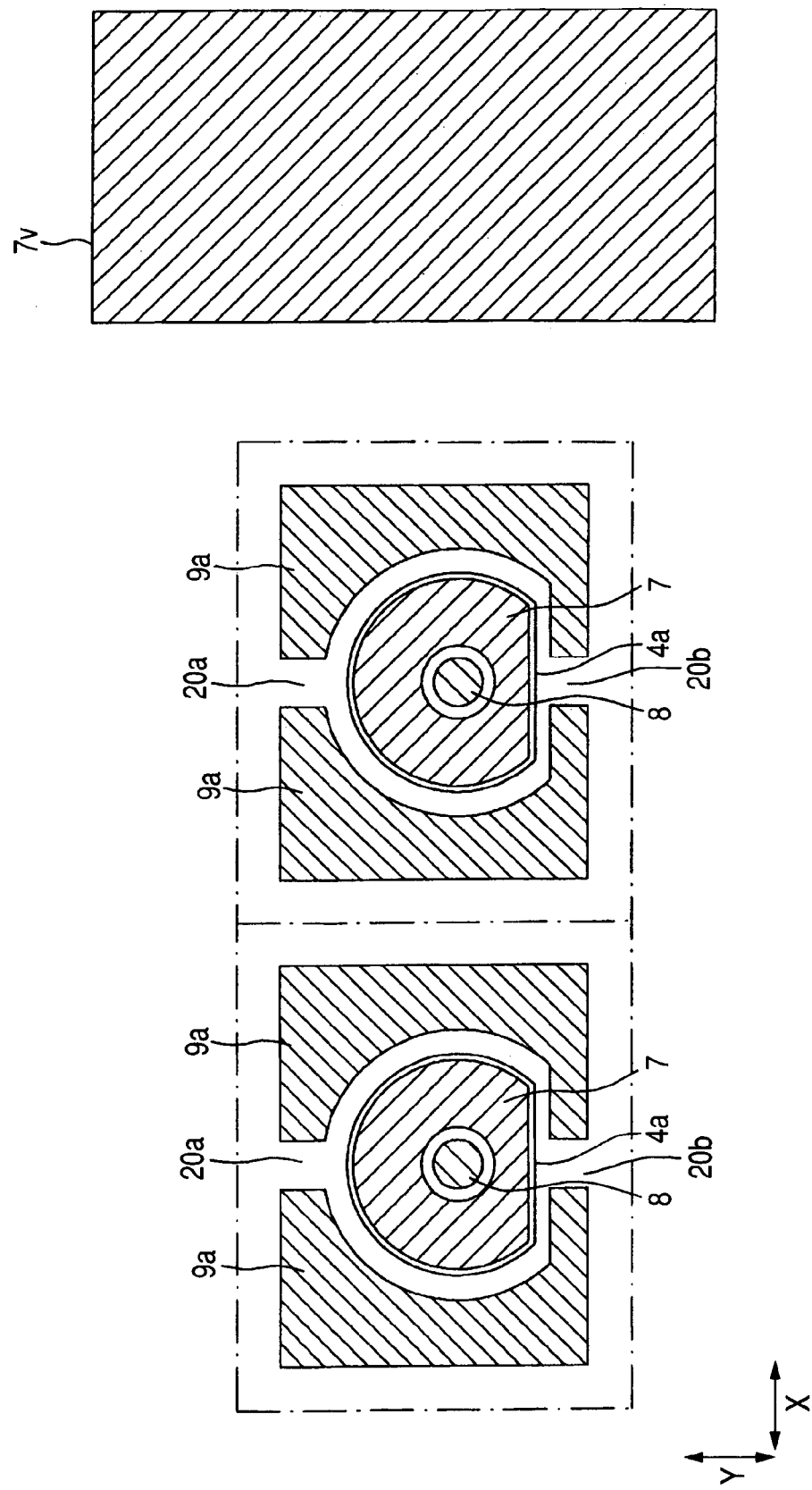
FIG. 14 is a fragmentary plan view of a substrate illustrating the manufacturing method of a semiconductor device (HBT) according to the one embodiment of the present invention.
Figure 16:
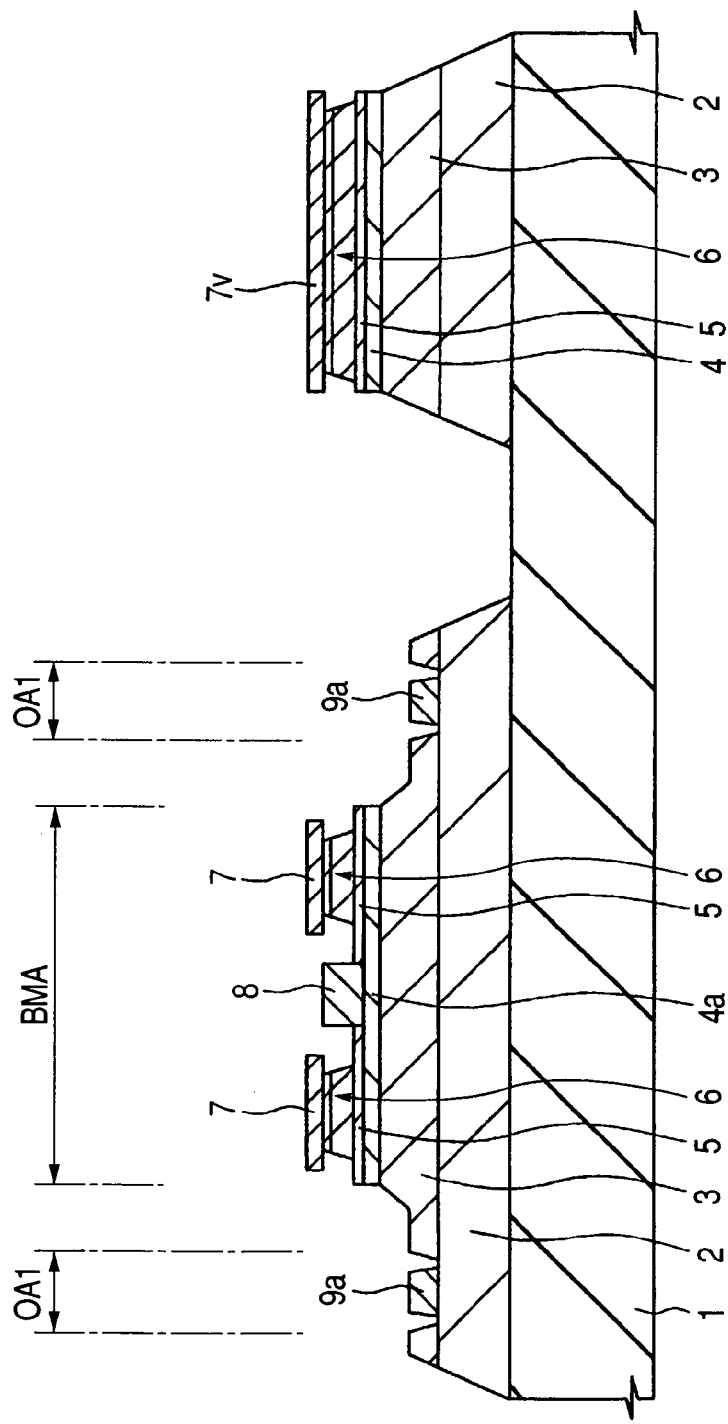
FIG. 16 is a fragmentary cross-sectional view of a substrate illustrating the manufacturing method of a semiconductor device (HBT) according to the one embodiment of the present invention.

As illustrated in FIGS. 14 and 16, the semiconductor device (HBT) of this embodiment has a base mesa 4a which has the form of a circle with a portion cut out of it. This base mesa 4a is made of a p type GaAs layer. An n type InGaP (emitter layer) 5 lies over this base mesa 4a, while an n type GaAs layer (collector layer) 3 lies below the base mesa 4a.

The base mesa 4a has, at the center thereof, a base electrode 8; and, over the n type InGaP (emitter layer) 5, an upper emitter layer 6 and an emitter electrode 7 are formed so as to surround the base electrode 8.

Around the base mesa 4a, a collector electrode 9a made of gold (Au) is formed. This collector electrode 9a is electrically connected to the n type GaAs layer (collector layer) 3 via an n$^+$ type GaAs layer (sub-collector layer). A combination of this n type GaAs layer (collector layer) 3 and n$^+$ type GaAs layer (sub-collector layer) 2 can be regarded as a collector layer.

What is characteristic here is that the pattern of the collector electrode 9a does not completely encompass the base mesa 4a, but is formed of a pair of members consisting of a first portion and a second portion separated by two cutout portions 20a,20b. These cutout portions 20a,20b each has a width of about 4 μm in the X direction. The width of each of these cutout portions 20a,20b in the X direction is smaller than the maximum width of the base mesa 4a in the X direction. The first portion has a substantially C-shaped pattern, while that of the second portion has an inverted C-shaped pattern. In other words, the collector electrode 9a has a pair of members consisting of a portion extending in the Y direction and a portion extending in the X direction from the opposite ends on the side of the pattern in the Y direction. The pattern consisting of the first portion and the second portion is electrically connected by a collector extraction interconnect M1c (refer to FIGS. 17 and 18). The width of each of these cutout portions 20a,20b may be approximately the minimum processing size (width limit of resolution by photolithography). Such narrowing of the width of the cutout portions 20a,20b in the X direction widens the collector electrode 9a, leading to an improvement in the properties of the device.

These cutout portions 20a,20b are disposed almost symmetrical to the base mesa 4a. A base extraction interconnect M1b is formed over one of these cutout portions 20a,20b via an insulating film (refer to FIG. 18).

Figure 22:
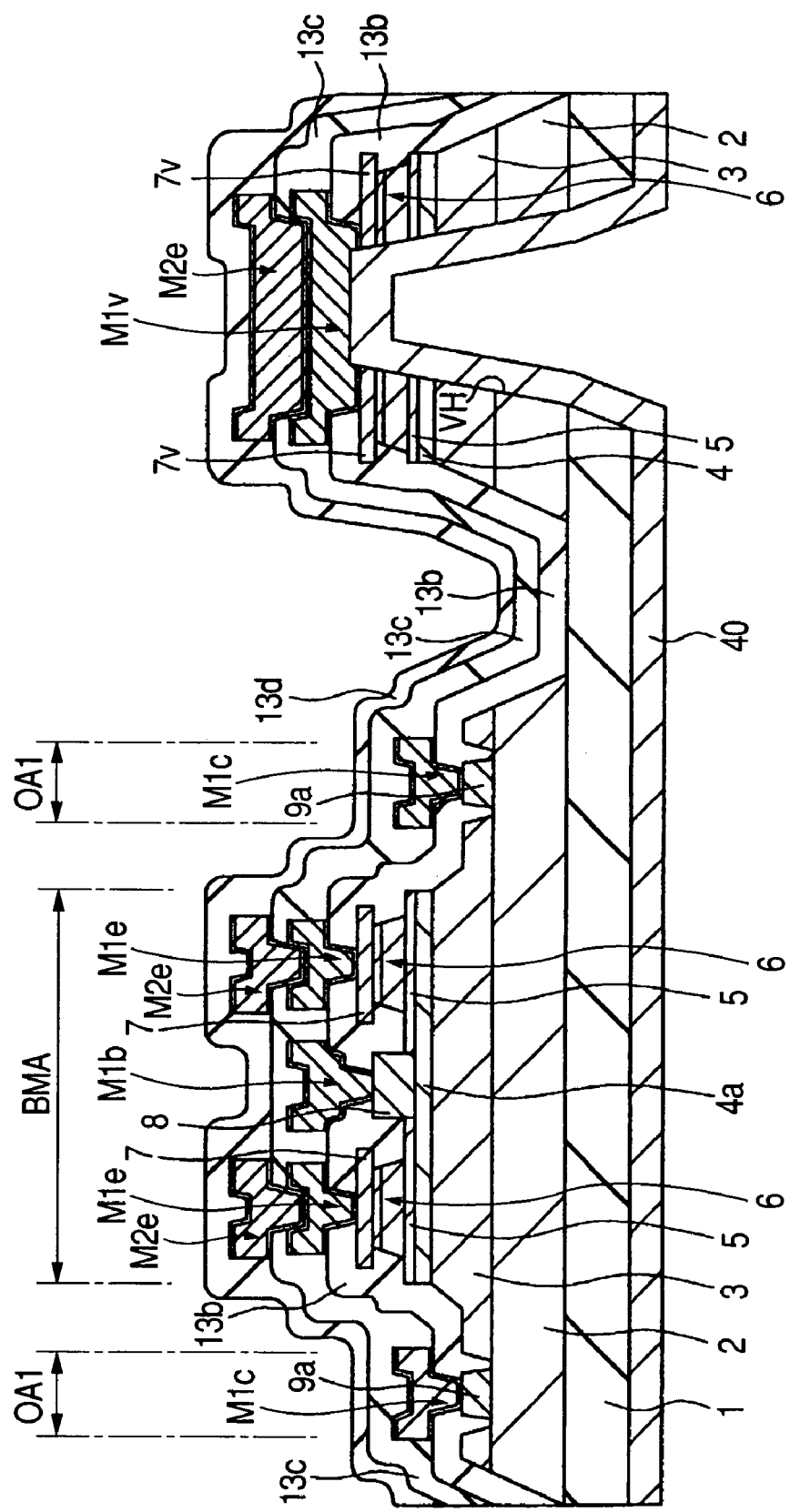
FIG. 22 is a fragmentary cross-sectional view of a substrate illustrating the manufacturing method of a semiconductor device (HBT) according to the one embodiment of the present invention.

As illustrated in FIG. 22, the backside via electrode 7v exists in the same layer with the emitter electrode 7 and a via hole VH reaches a first-level interconnect M1v over the backside via electrode 7v. On the back side of the semi-insulating GaAs substrate 1, including the inside of the via hole VH, a back electrode (backside interconnect) 40 is formed.

The semiconductor device (HBT) of this embodiment will be described next in accordance with its manufacturing steps.

As illustrated in FIG. 1, an n$^+$ type GaAs layer (sub-collector layer) 2, which is about 700 nm thick, is allowed to grow over a semi-insulating GaAs substrate (which will hereinafter simply be called a "substrate"), which is about 600 μm thick, by the metal organic chemical vapor deposition method (MOCVD). Over the sub-collector layer, an n type GaAs layer (collector layer) 3, which is about 700 nm thick, and a p type GaAs layer (base layer) 4, which is about 100 nm thick, are formed successively by the MOCVD method.

An n type InGaP layer (emitter layer), which is about 35 nm thick, is deposited by the MOCVD method, followed by the formation thereover of an upper emitter layer 6 having a thickness of 400 nm. This upper emitter layer 6 is made of a stacked film consisting of an n type GaAs layer and an n type InGaAs layer formed thereover. The n type InGaAs layer in the upper emitter layer 6 is used for forming an ohmic contact with an emitter electrode 7, which will be described later.

As described above, semiconductors different in kind (hetero junction) are used for the base layer (p type GaAs layer) 4 and the emitter layer (n type InGaP) 5.

A conductive film, for example, a tungsten silicide (WSi) film, which is about 300 nm thick, is deposited by sputtering. The Wsi film thus formed is then processed by photolithography and dry etching, whereby an emitter electrode 7 and backside via electrode 7v are formed.

Figure 2:
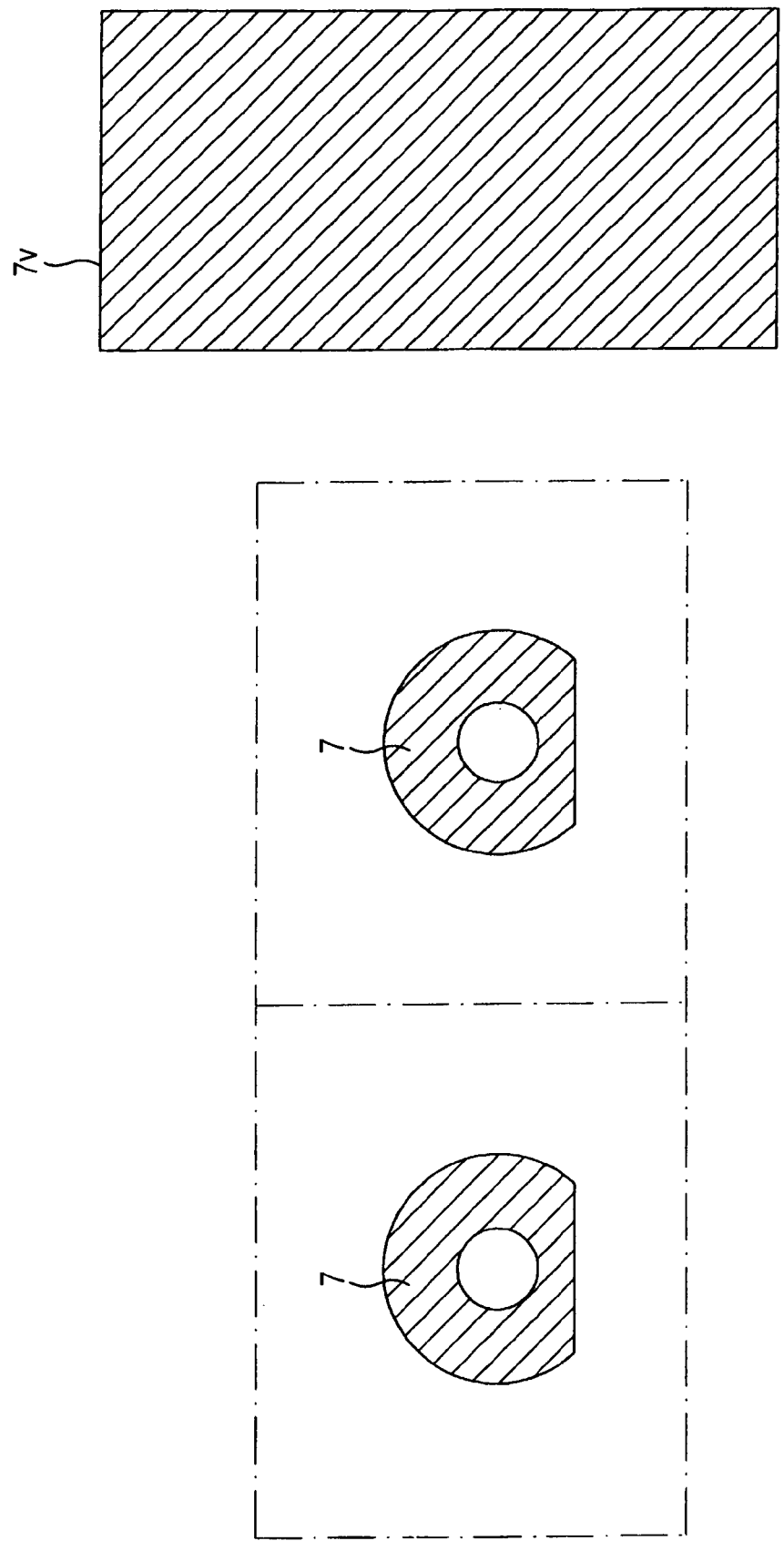
FIG. 2 is a fragmentary plan view of a substrate illustrating the manufacturing method of a semiconductor device (HBT) according to the one embodiment of the present invention.
Figure 21:
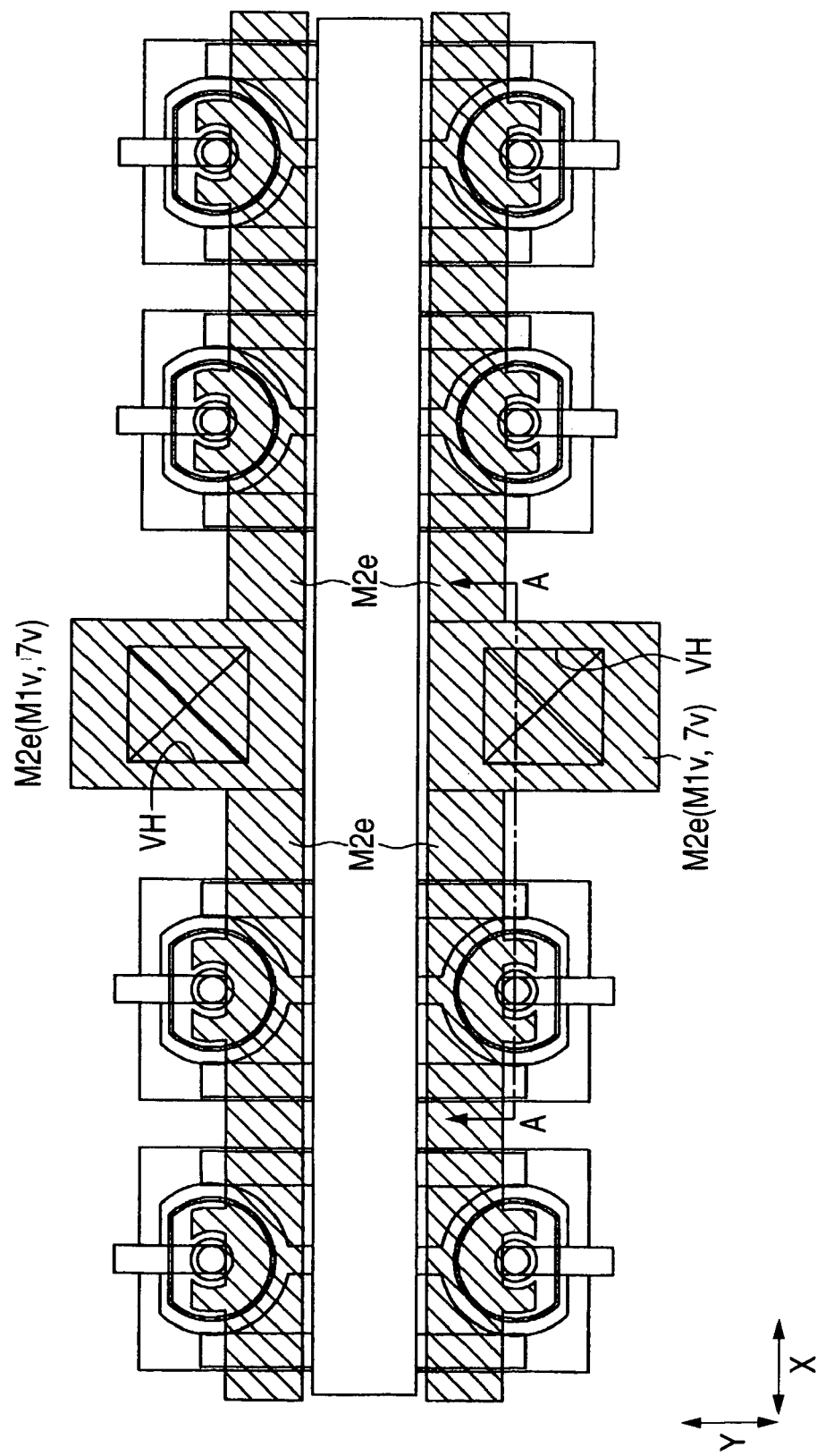
FIG. 21 is a fragmentary plan view of a substrate illustrating the manufacturing method of a semiconductor device (HBT) according to the one embodiment of the present invention.

FIG. 2 is a fragmentary plan view of the emitter electrode 7 after its formation. As illustrated in FIG. 2, the emitter electrode 7 has a pattern formed by an arc and a cord but lacking its center portion. In other words, it has an imperfect doughnut shape. In a substantially circular region in which the emitter electrode 7 is not formed, a base electrode is formed. A dashed line defining a rectangular shape in FIG. 2 indicates a region in which one HBT is to be formed. FIG. 2 includes only two HBT formation regions; however, as illustrated in FIG. 21, a plurality of blocks in which a HBT is to be formed exist, and the backside via electrode 7v is formed between these blocks.

Figure 3:
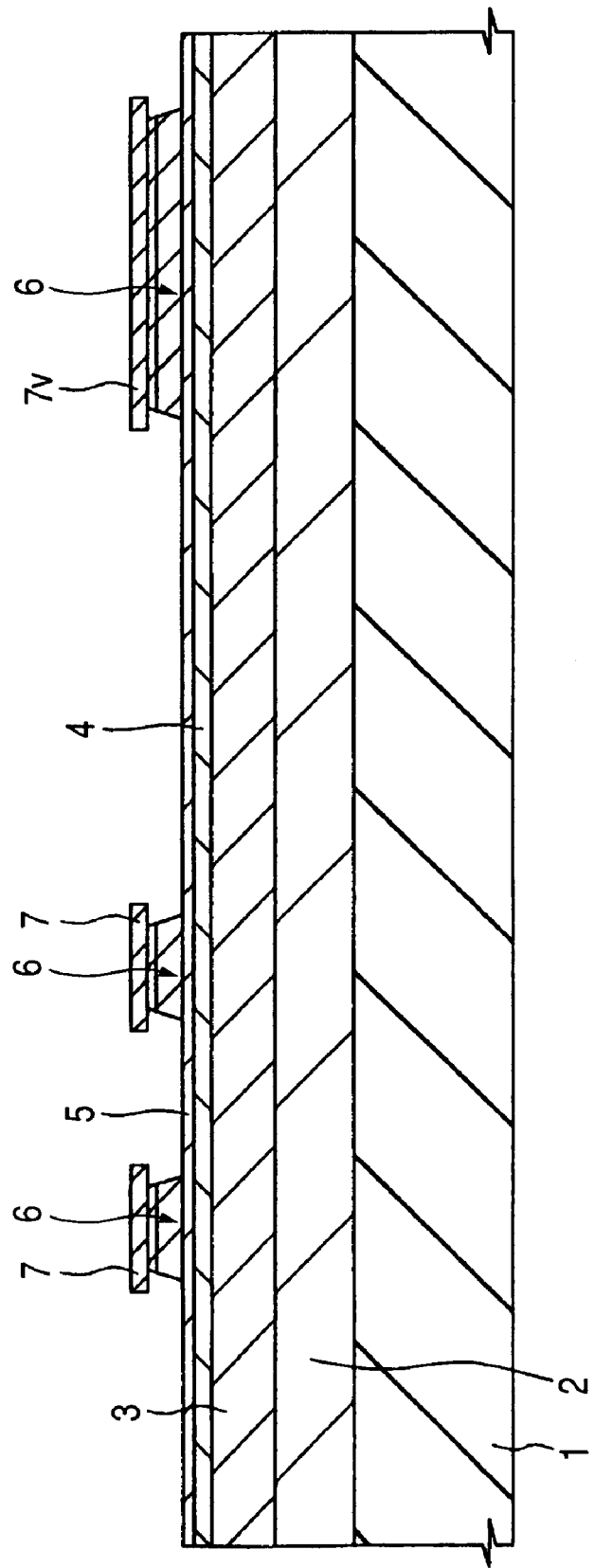
FIG. 3 is a fragmentary cross-sectional view of a substrate illustrating the manufacturing method of a semiconductor device (HBT) according to the one embodiment of the present invention.

As illustrated in FIG. 3, using the emitter electrode 7 and backside via electrode 7v as masks, the upper emitter layer 6 is wet etched to expose the n type InGaP layer (emitter layer) 5. The p type GaAs layer (base layer) 4 may be exposed by etching of the n type InGaP layer (emitter layer) 5.

Figure 4:
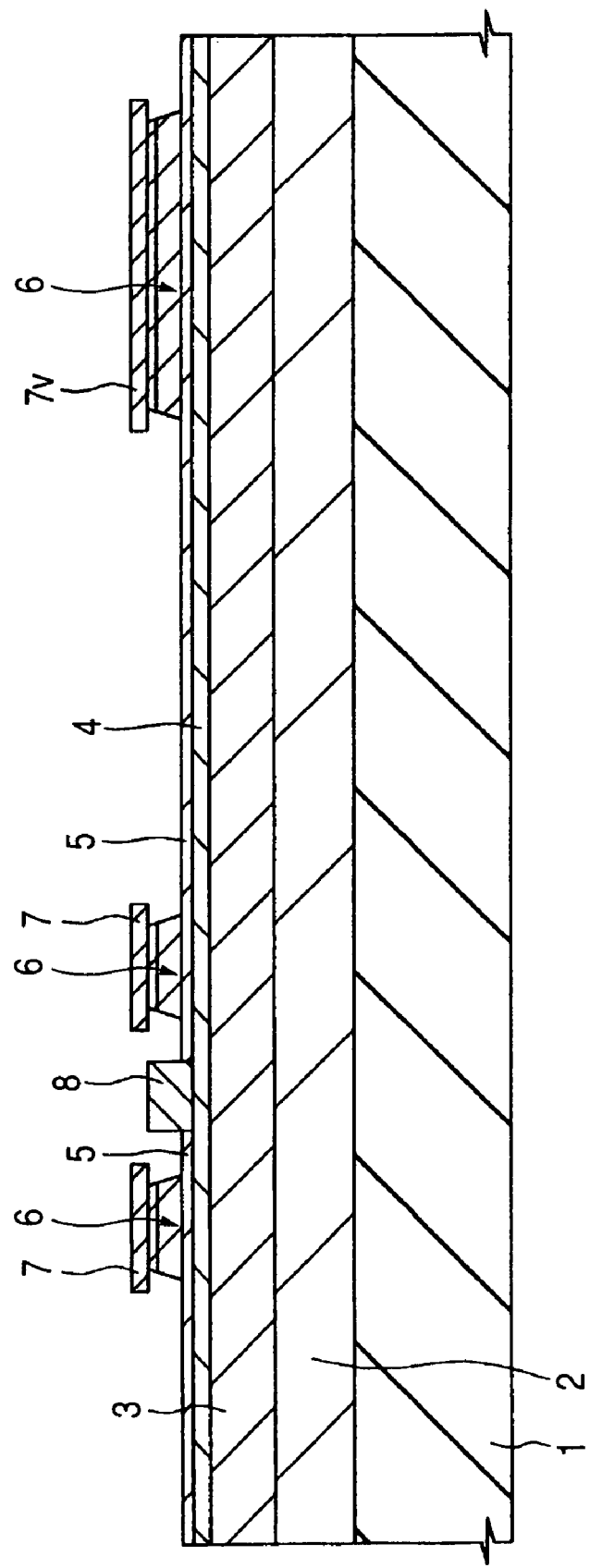
FIG. 4 is a fragmentary cross-sectional view of a substrate illustrating the manufacturing method of a semiconductor device (HBT) according to the one embodiment of the present invention.

As illustrated in FIG. 4, a base electrode 8 made of a stacked film of platinum (Pt), titanium (Ti), molybdenum (Mo), Ti and gold (Au), which is stacked in the order of mention, is formed. Its thickness is, for example, about 300 nm. This base electrode 8 can be formed, for example, by the lift-off method. The lift-off method will be described more specifically later. By heat treatment (alloying), the Pt lying on the bottom of the base electrode 8 is caused to react with the n type InGaP layer (emitter layer) and p type GaAs layer (base layer) 4. By this reaction, ohmic contact between the base electrode 8 and the p type GaAs layer (base layer) 4 can be formed.

Figure 5:
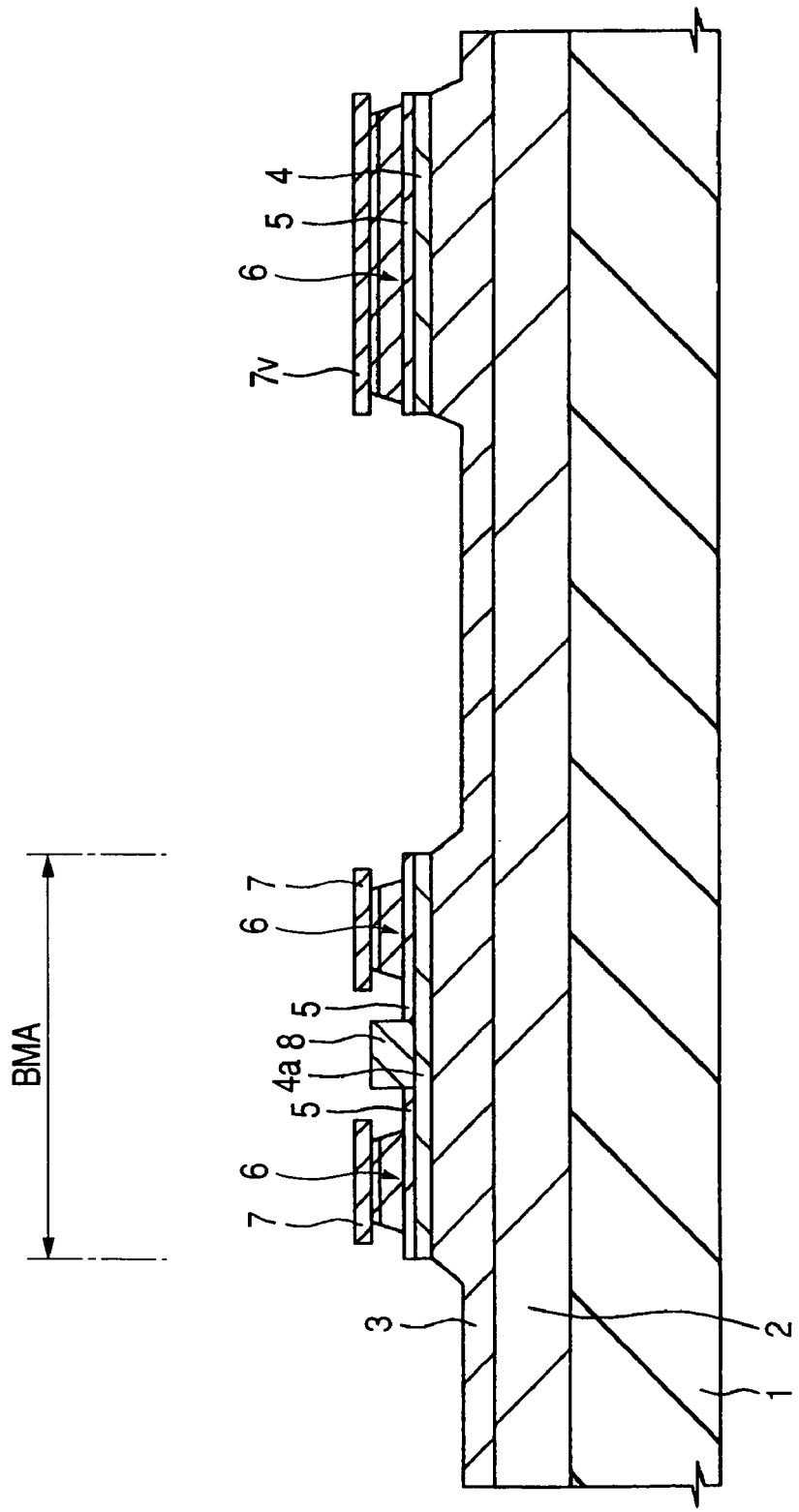
FIG. 5 is a fragmentary cross-sectional view of a substrate illustrating the manufacturing method of a semiconductor device (HBT) according to the one embodiment of the present invention.

As illustrated in FIG. 5, the n type InGaP layer (emitter layer) 5 and p type GaAs layer (base layer) 4 are etched by a photolithography and wet etching technique, whereby a base mesa 4a is formed. BMA in this diagram indicates the formation region of the base mesa 4a. As an etchant, a mixed aqueous solution of phosphoric acid and hydrogen peroxide is used, for example. By this etching for separation, each transistor has its own n type InGaP layer (emitter layer) 5 and base mesa 4a.

Figure 6:
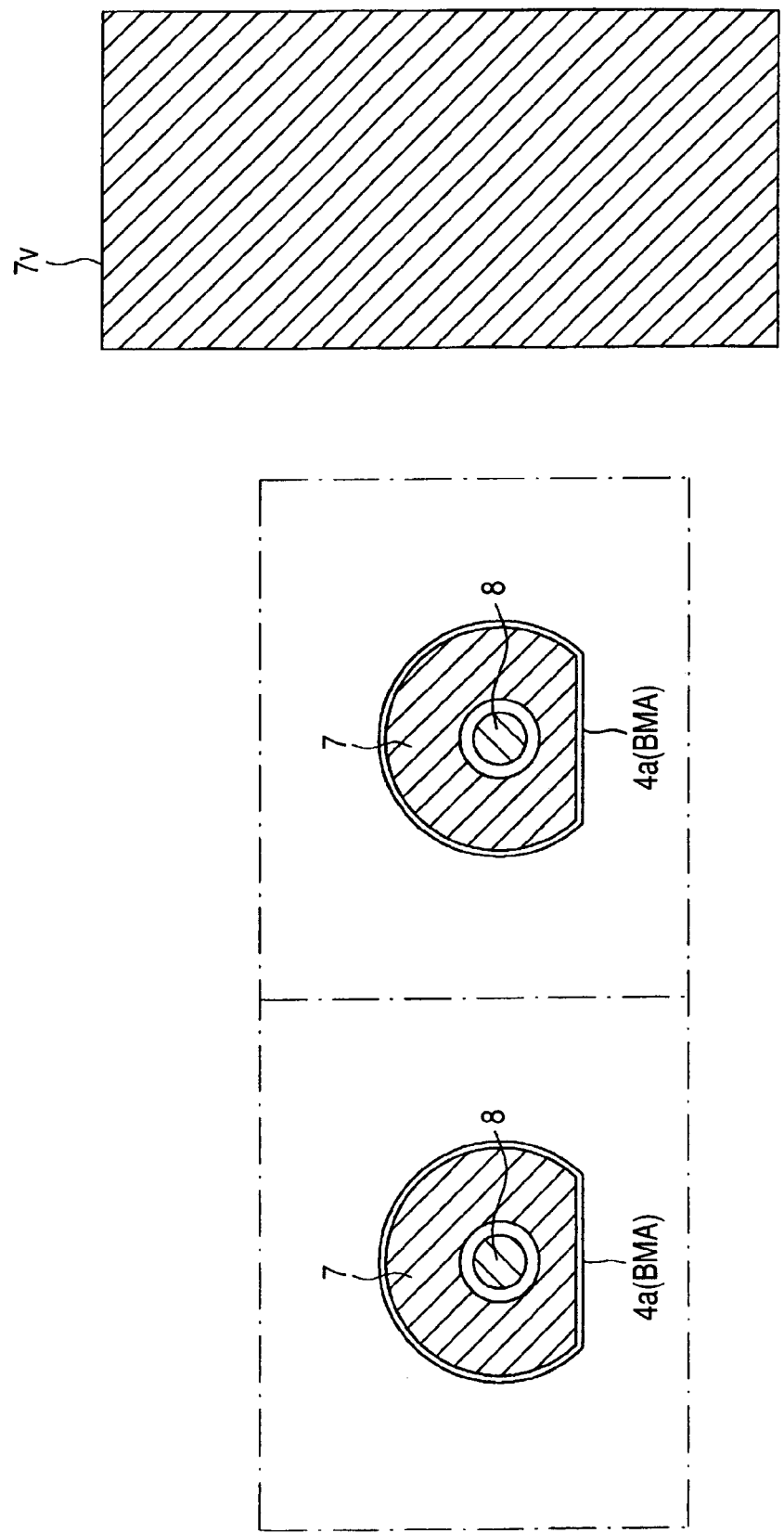
FIG. 6 is a fragmentary plan view of a substrate illustrating the manufacturing method of a semiconductor device (HBT) according to the one embodiment of the present invention.

The formation region (BMA) of the base mesa 4a is, as illustrated in FIG. 6, a circle with a portion cut out. In other words, its shape is defined by an arc having a center angle of 180 degree or greater and a cord connecting opposite ends of the arc. A region other than the central portion (base electrode 8) becomes a pn junction portion between the n type InGaP layer (emitter layer) 5 and p type GaAs layer (base layer) 4.

From the viewpoint of high frequency properties, the junction capacity Cbc between the base layer and the collector layer is preferably smaller relative to the area of the same emitter layer. In other words, the formation region of the base mesa which is smaller relative to the area of the same emitter layer is preferred.

As in this embodiment, by forming the base mesa 4a to have substantially the same outer circumference with that of the emitter layer 5, the formation region of the base mesa 4a can be made smaller than that of the emitter layer 5, resulting in a lowering of the junction capacity Cbc.

The base electrode 8 is located over almost the central portion of this base mesa 4a, and the emitter electrode 7 (upper emitter layer 6) exists at the outer periphery of the base electrode 8.

Upon formation of the base mesa 4a, the n type InGaP layer (emitter layer) 5 and p type GaAs layer (base layer) 4 are also removed by etching from the periphery of the backside via electrode 7v.

Upon etching of the p type GaAs layer (base layer) 4 and the like, the underlying n type GaAs layer (collector layer) 3 is also etched by about 300 nm.

Figure 7:
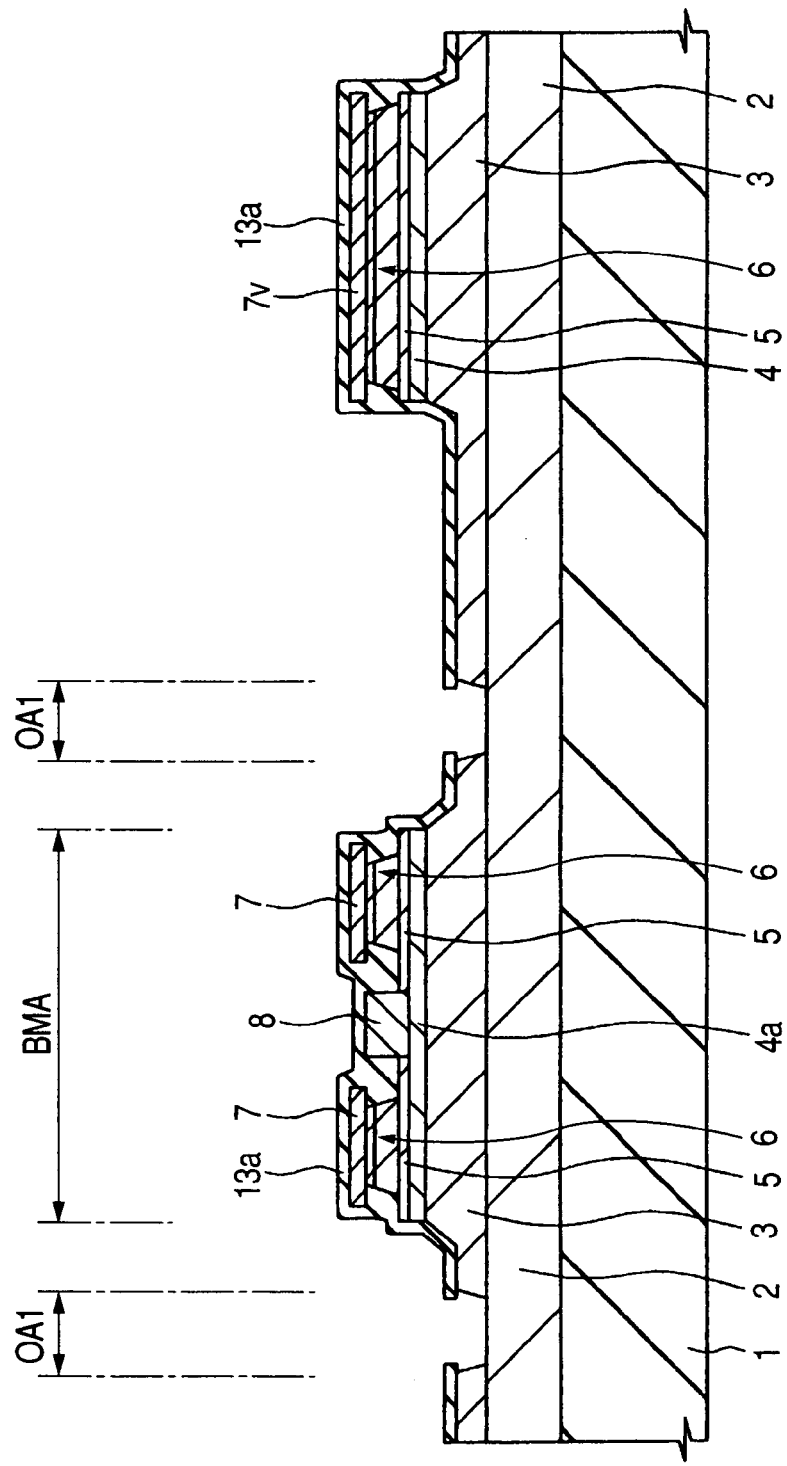
FIG. 7 is a fragmentary cross-sectional view of a substrate illustrating the manufacturing method of a semiconductor device (HBT) according to the one embodiment of the present invention.

As illustrated in FIG. 7, an insulating film (for example, a silicon oxide film) 13a, which is about 100 nm thick, is deposited over the substrate 1. This insulating film 13a serves to protect the base electrode 8, but the formation of it may be omitted.

Figure 8:
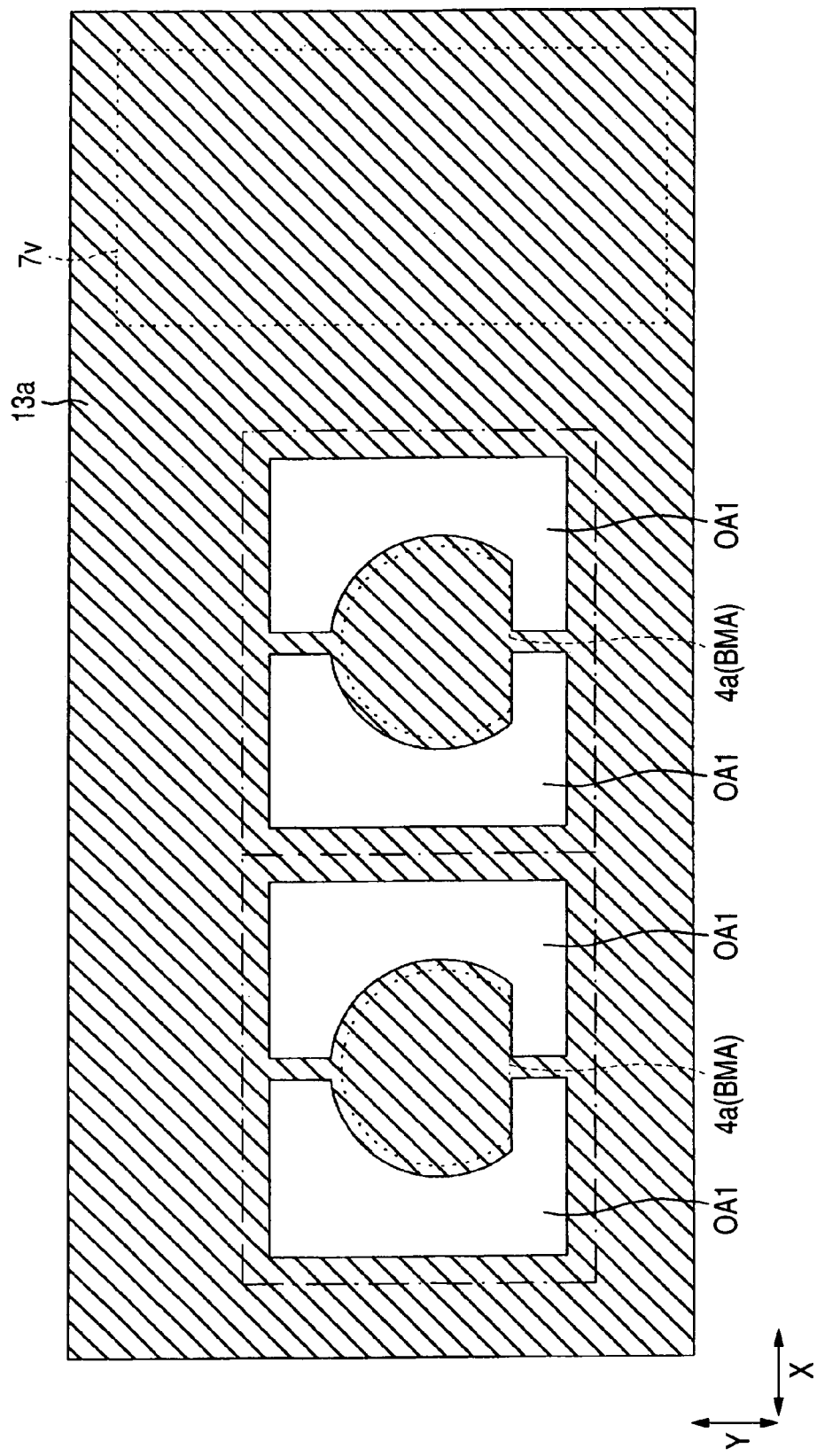
FIG. 8 is a fragmentary plan view of a substrate illustrating the manufacturing method of a semiconductor device (HBT) according to the one embodiment of the present invention.

By selectively etching the insulating film 13a and n type GaAs layer (collector layer) 3, the n$^+$ type GaAs layer (sub-collector layer) 2 is partially exposed. This exposed region is defined as OA1. FIG. 8 is a fragmentary plan view of the region OA1 after its formation.

A step of forming a collector electrode in this region OA1 by the lift-off method will be described next.

Figure 9:
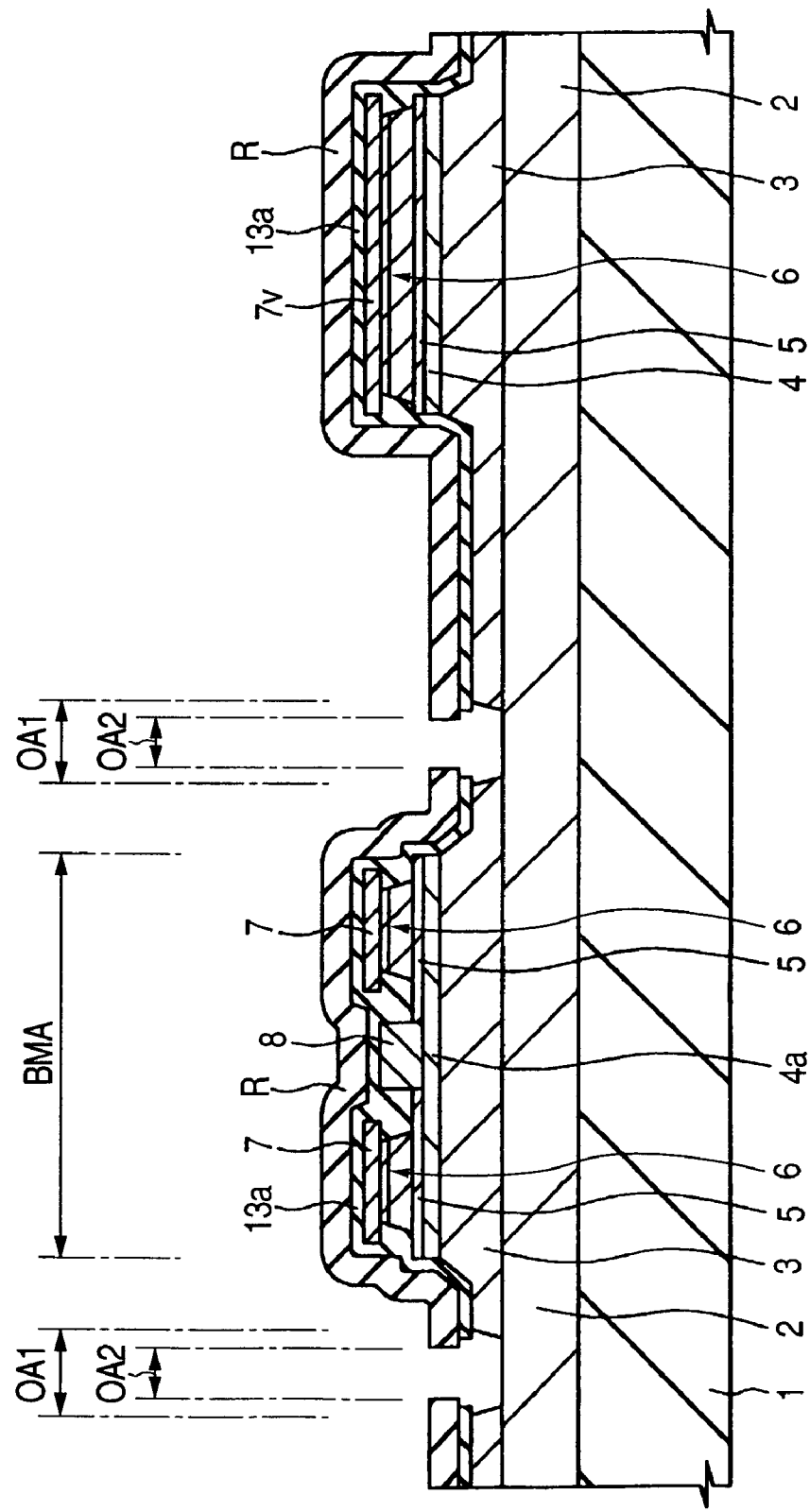
FIG. 9 is a fragmentary cross-sectional view of a substrate illustrating the manufacturing method of a semiconductor device (HBT) according to the one embodiment of the present invention.
Figure 10:
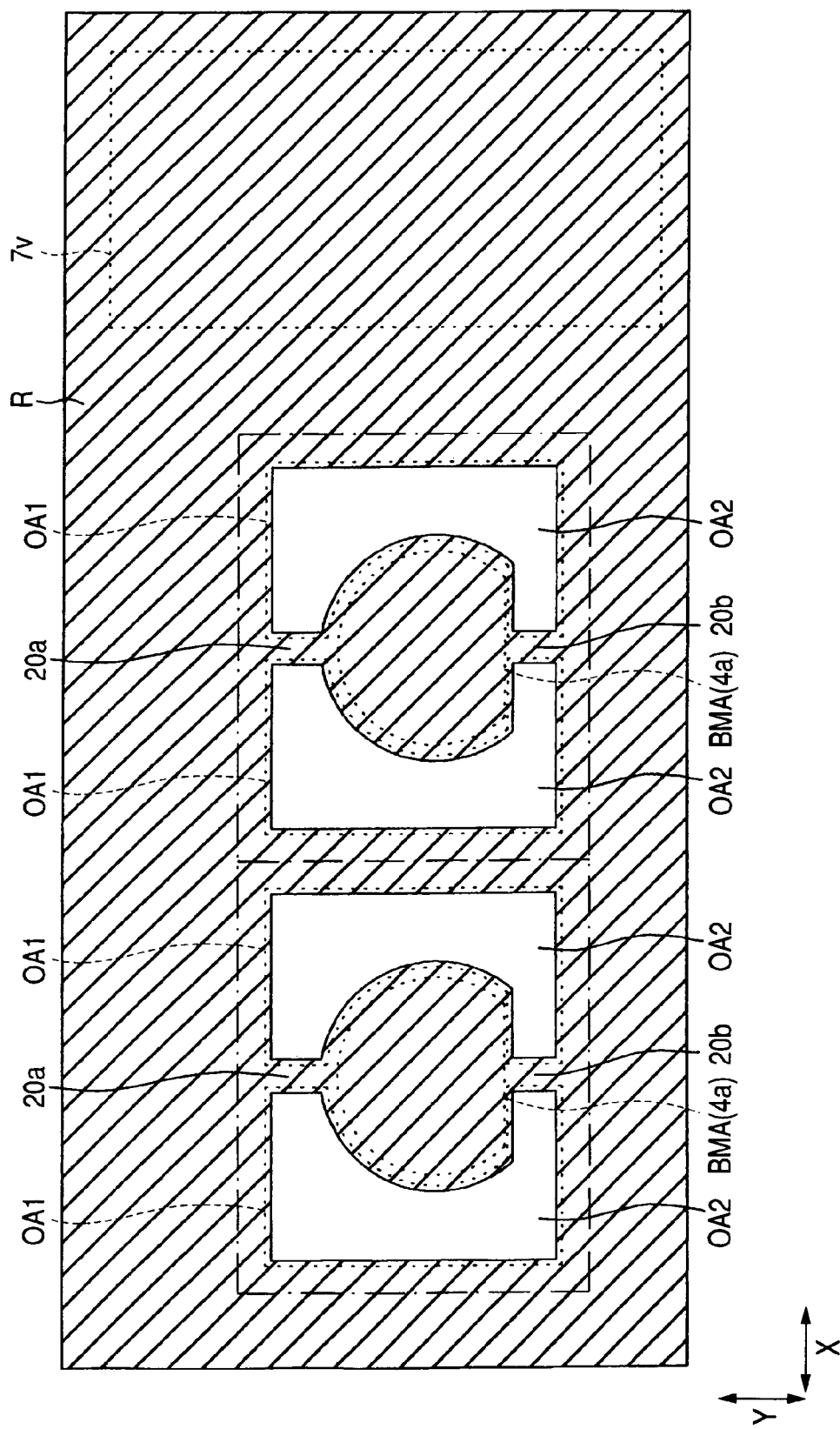
FIG. 10 is a fragmentary plan view of a substrate illustrating the manufacturing method of a semiconductor device (HBT) according to the one embodiment of the present invention.

As illustrated in FIG. 9, a photoresist film (which will hereinafter simply be called a "resist film") R is formed over the entire surface of the substrate 1, and the resist film R over the region OA1 is then removed by photolithography. As a result, the n$^+$ GaAs layer (sub-collector layer) 2 is exposed from the region OA1. An opening portion OA2 of the resist film R is formed so as to be smaller than the region OA1 (FIG. 10). In other words, the resist film R is caused to hang over the end portions of the insulating film 13a or the n type GaAs layer (collector layer) 3 underlying the resist film R (like an overhang). The resist film R may be formed to have an inverse tapered shape.

Figure 11:
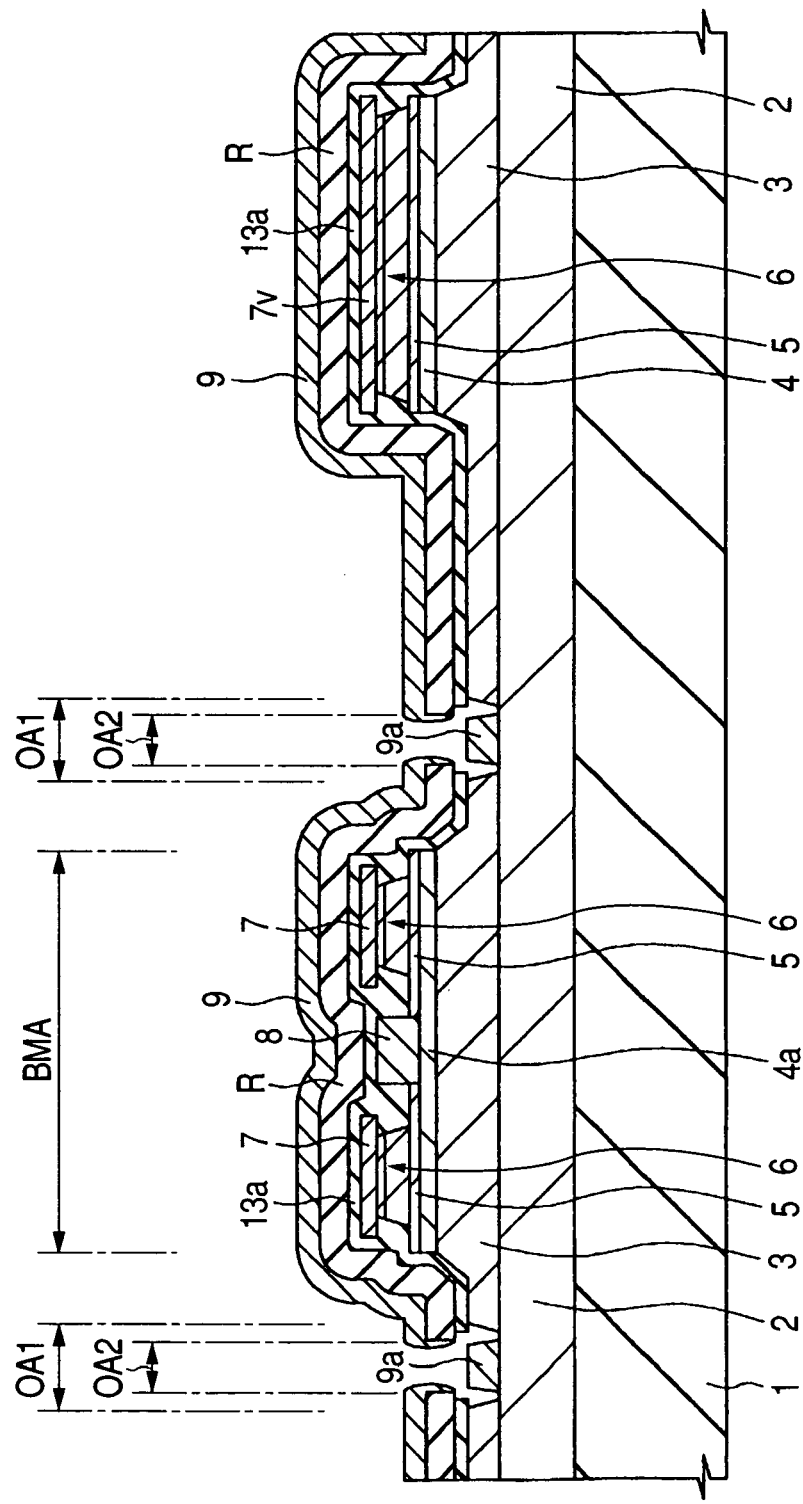
FIG. 11 is a fragmentary cross-sectional view of a substrate illustrating the manufacturing method of a semiconductor device (HBT) according to the one embodiment of the present invention.
Figure 12:
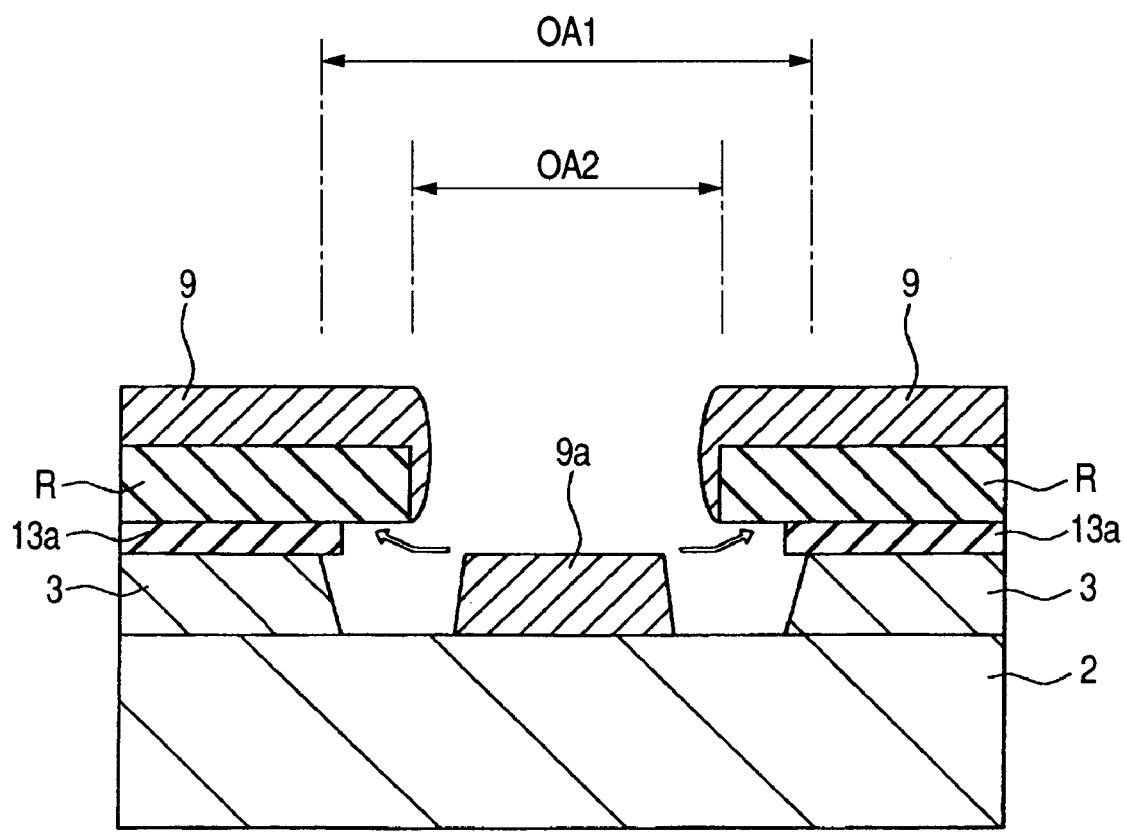
FIG. 12 is a fragmentary cross-sectional view of a substrate illustrating the manufacturing method of a semiconductor device (HBT) according to the one embodiment of the present invention.
Figure 13:
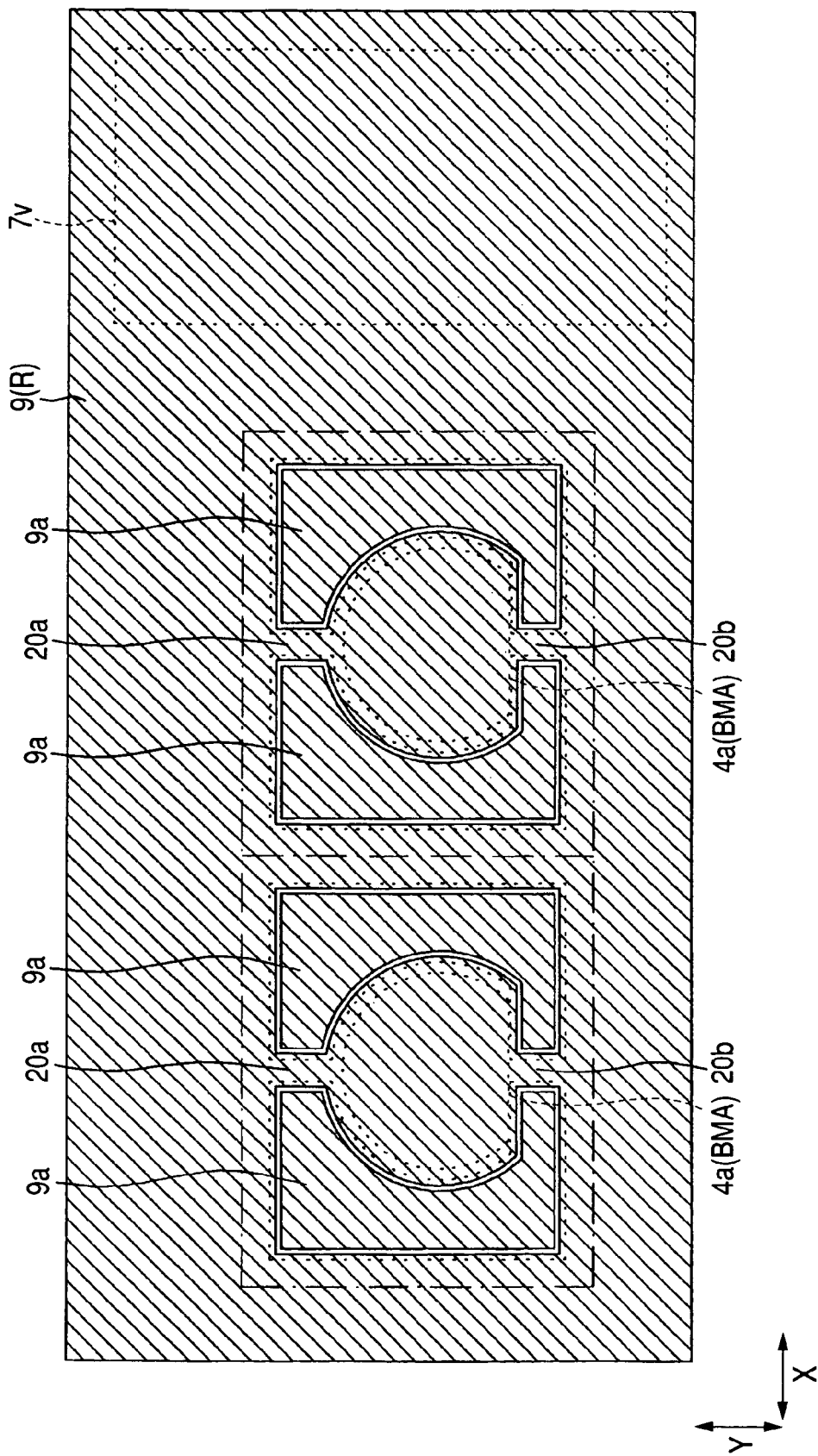
FIG. 13 is a fragmentary plan view of a substrate illustrating the manufacturing method of a semiconductor device (HBT) according to the one embodiment of the present invention.

As illustrated in FIGS. 11 to 13, gold germanium (AuGe), nickel (Ni) and Au are stacked successively one after another in the order of mention over the entire surface of the substrate 1 to form stacked films 9,9a. FIG. 12 is a partially enlarged view illustrating the vicinity of the region OA1, while FIG. 13 is a fragmentary plan view illustrating the stacked films 9,9a after formation.

As illustrated in this diagram, the stacked films 9 and 9a are formed over the resist film R and in the opening portion OA2, respectively. The resist film R is formed to hang over so that over the side walls of the insulating film 13a or n type GaAs layer (collector layer) 3, the stacked film 9 is not deposited. The lower surface of the resist film R is exposed from the end portion of the insulating film 13a.

The resist film R is then removed by a peeling solution (etchant). The etchant penetrates from the exposed part of the lower surface of the resist film R and dissolves the resist film R (FIG. 12). When the resist film R is removed in such a manner, the stacked film 9 thereover is also removed by peeling. The stacked film remains only inside of the opening portion OA2 (over the region OA1) and becomes a collector electrode 9a. The fragmentary plan view of the collector electrode 9a after its formation is illustrated in FIG. 14, and a fragmentary cross-sectional view thereof is illustrated in FIG. 16.

What is important here is that two cutout portions (pattern lacking portions 20a,20b) are disposed in the pattern of the collector electrode 9a. These cutout portions (20a,20b) may be regarded as a connection portion of the resist film R (stacked film 9) (refer to FIGS. 10 and 13). As a result of the formation of the resist film R (stacked film 9) over the connection portions (20a,20b) between the peripheral portions (third region) in the region OA1 and a region (first region) in which the base mesa 4a has been formed, the cutout portions are formed. The pattern of the collector electrode 9a is separated by these cutout portions and is formed of two patterns, that is, a first portion and a second portion (FIG. 14).

Figure 15:
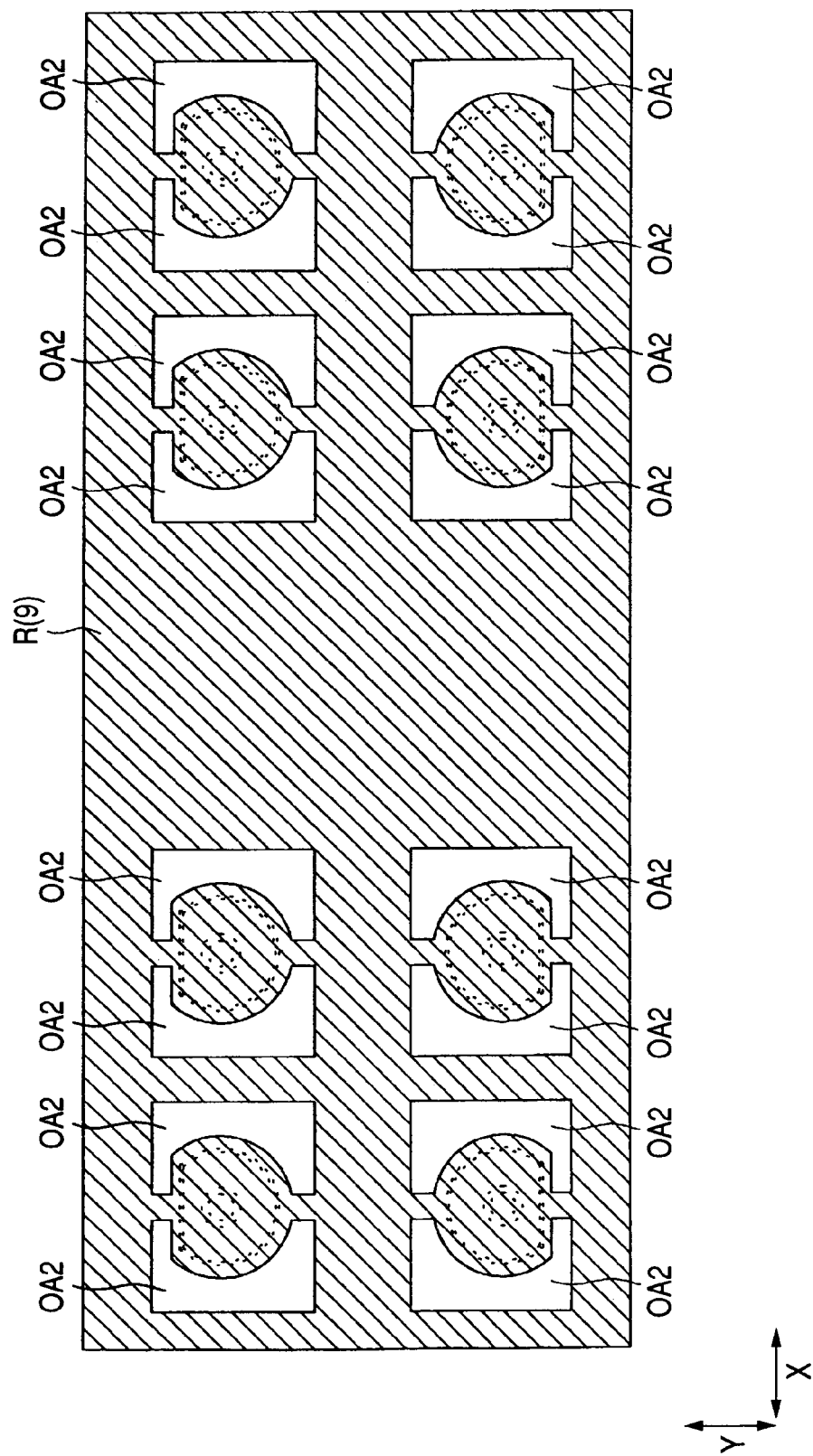
FIG. 15 is a fragmentary plan view of a substrate illustrating the manufacturing method of a semiconductor device (HBT) according to the one embodiment of the present invention.

According to this embodiment, the stacked film 9 over the base mesa 4a does not become an independent pattern, but is linked with the stacked film 9 at the outer periphery of the region OA1, which facilitates the peeling of the stacked film 9. FIG. 15 illustrates the state of the stacked film 9 over a plurality of HBT formation regions (blocks).

Figure 23:
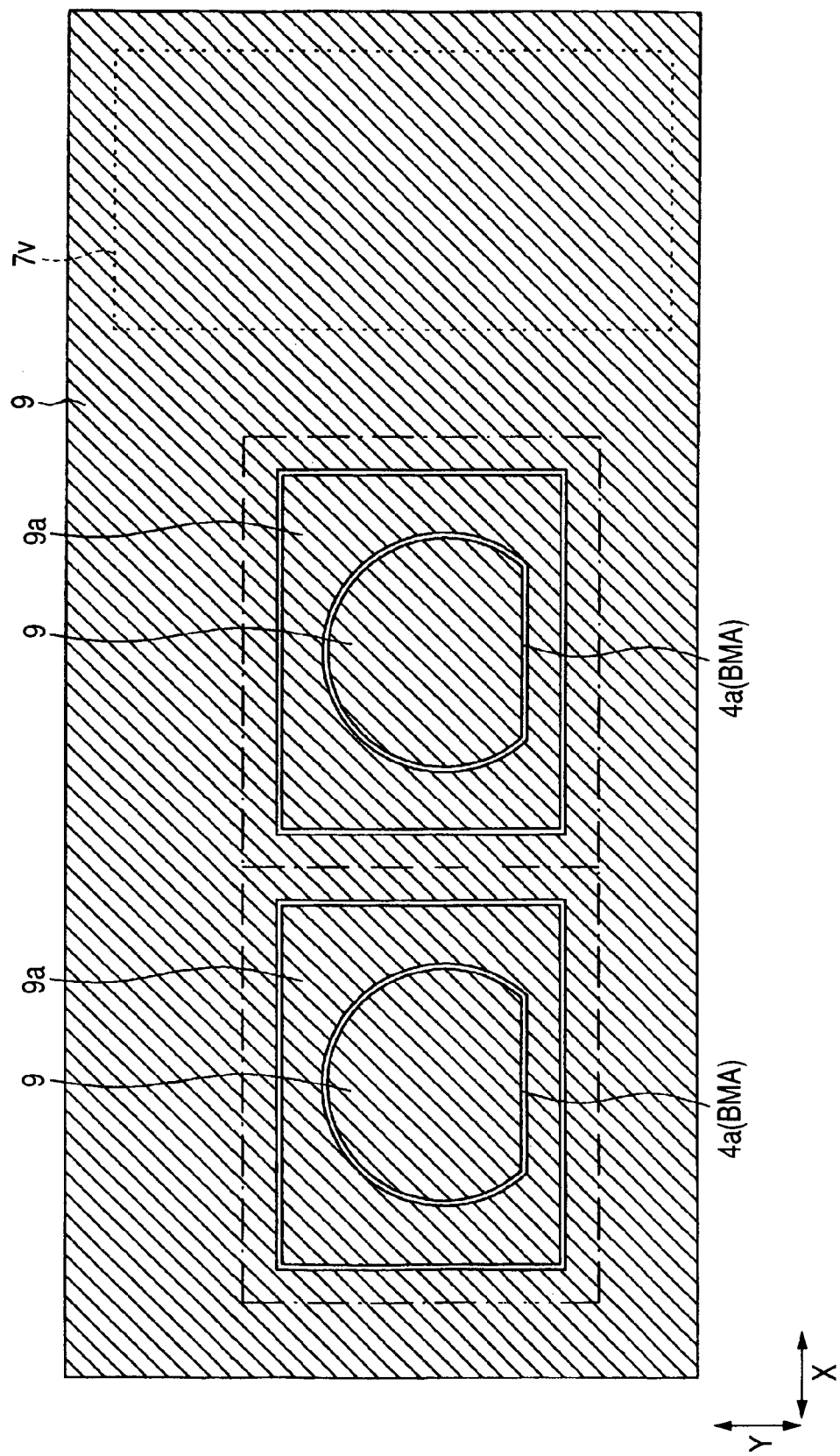
FIG. 23 is a fragmentary plan view of a substrate illustrating the manufacturing method of a semiconductor device (HBT) for explaining the advantage of the present invention.
Figure 24:
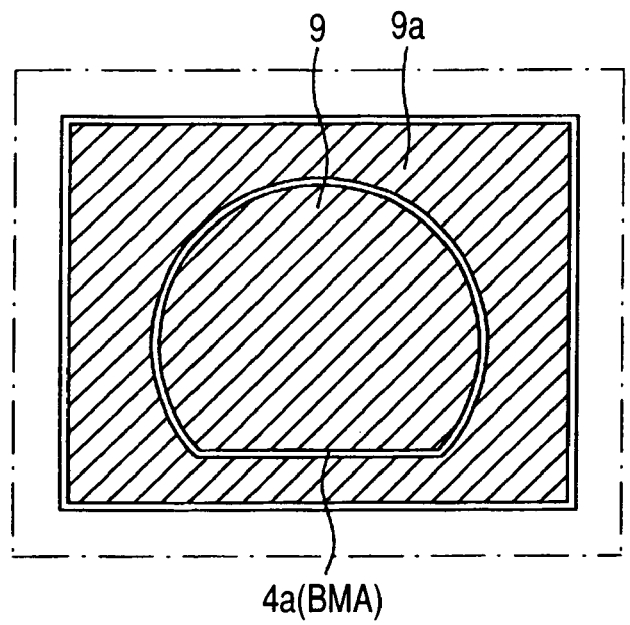
FIG. 24 is a fragmentary plan view of a substrate illustrating the manufacturing method of a semiconductor device (HBT) for explaining the advantage of the present invention.

As illustrated in FIG. 23, when no cutout portions are disposed in the pattern of the collector electrode 9a, the stacked film 9 over the base mesa 4a becomes an isolated pattern and cannot be peeled easily (FIG. 24). In other words, the longer the perimeter of the pattern of the stacked film 9 to be removed, the more easily it is peeled. When the pattern becomes an isolated D-shaped pattern, its perimeter becomes short and the stacked film 9 tends to remain.

Figure 25:
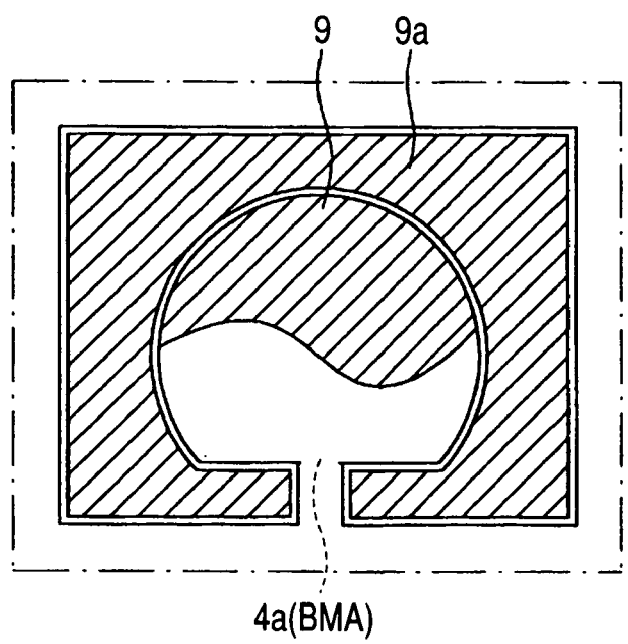
FIG. 25 is a fragmentary plan view of a substrate illustrating the manufacturing method of a semiconductor device (HBT) for explaining the advantage of the present invention.

Provision of the two cutout portions, as in this embodiment, makes it easy to prevent the retention of the stacked film 9 over the base mesa 4a. For example, when there is only one cutout portion, as illustrated in FIG. 25, the stacked film 9 tends to remain in a region opposite to the one cutout portion.

A gap is formed between the resist film R and the stacked film 9 owing to the peeling force of the stacked film 9 at the outer periphery of the region OA1, which is a relatively large pattern, and peeling proceeds further. The stacked film 9 over the base mesa 4a can be easily peeled off when there are two starting points of peeling. In addition, when these starting points are located at positions opposite to each other in the pattern of the base mesa 4a, the peeling of the stacked film 9 over the base mesa 4a becomes even easier (refer to FIG. 15).

These two cutout portions do not necessarily need to exist at opposite positions, that is, on both sides relative to the center of the HBT formation region. For example, an angle formed by lines connecting two cutout portions and the center of the HBT formation region may be 90° or greater. Also, the number of cutout portions may exceed 2.

When one of the two cutout portions is disposed at a chord of the region of the base mesa 4a, a base extraction interconnect M1b, which will be described later, can be formed more easily. Moreover, if so, the parasitic capacitance between the base extraction interconnect M1b and collector extraction interconnect M1c (collector electrode 9a) can be reduced.

As illustrated in FIG. 16, the insulating film 13a is then removed, followed by the removal of the n type GaAs layer (collector layer) 3 and n$^+$ type GaAs layer (sub-collector layer) 2 from the outside of the collector electrode 9a by etching, whereby the transistors are electrically separated from each other. At this time, the n type GaAs layer (collector layer) 3 and n$^+$ type GaAs layer (sub-collector layer) 2 at the periphery of the backside via electrode 7v are also removed.

The separation between transistors may be effected by implantation of a p type impurity into the n$^+$ type GaAs layer (sub-collector layer) 2 outside the collector electrode 9a (pn separation).

Figure 17:
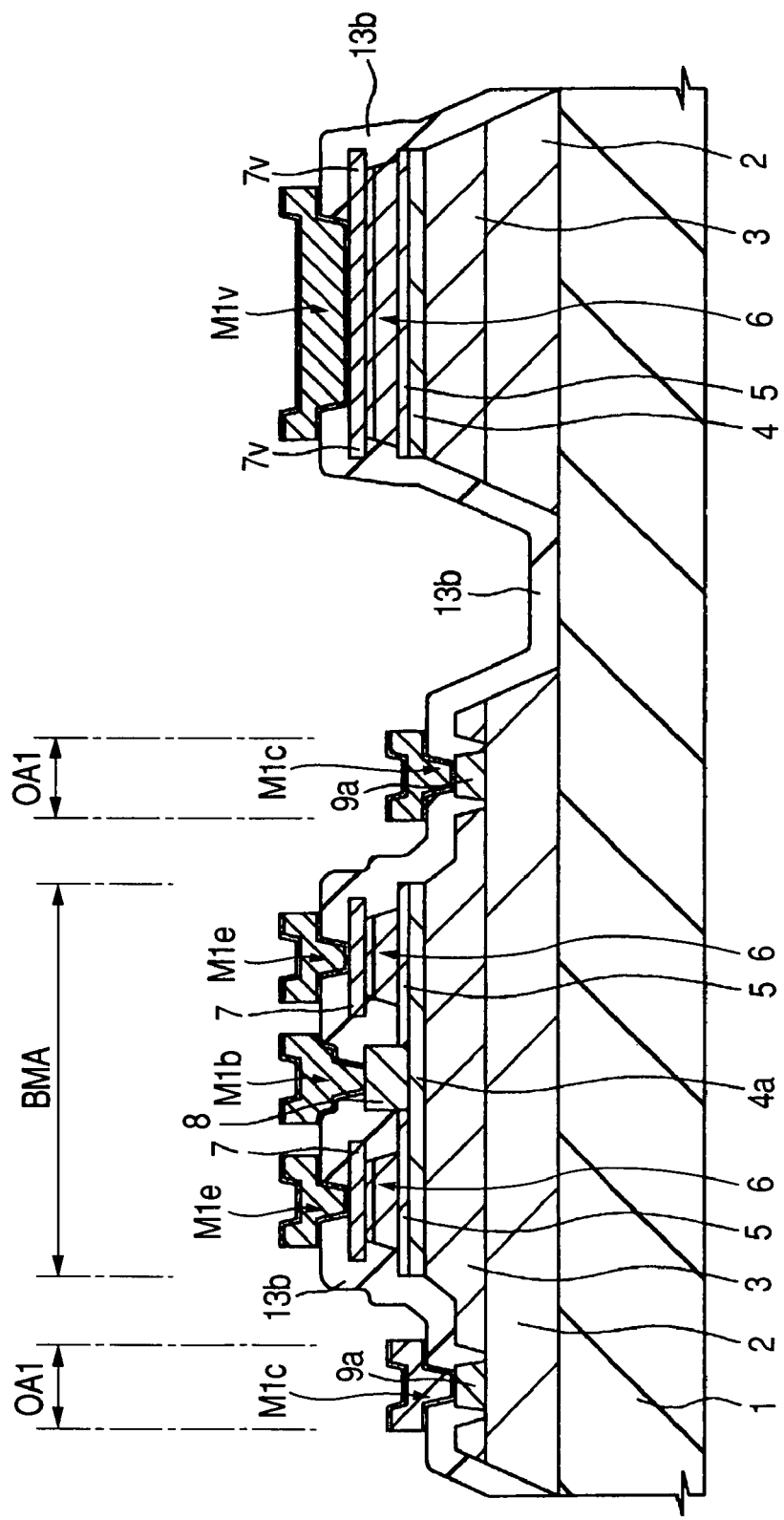
FIG. 17 is a fragmentary cross-sectional view of a substrate illustrating the manufacturing method of a semiconductor device (HBT) according to the one embodiment of the present invention.

As illustrated in FIG. 17, an insulating film 13b, such as a silicon oxide film, is deposited by CVD over the substrate 1. Etching of the n type GaAs layer (collector layer) 3 and the n$^+$ type GaAs layer (sub-collector layer) 2 for separation is carried out while leaving the insulating film 13a, and the insulating film 13b may be formed over the insulating film 13a.

Figure 18:
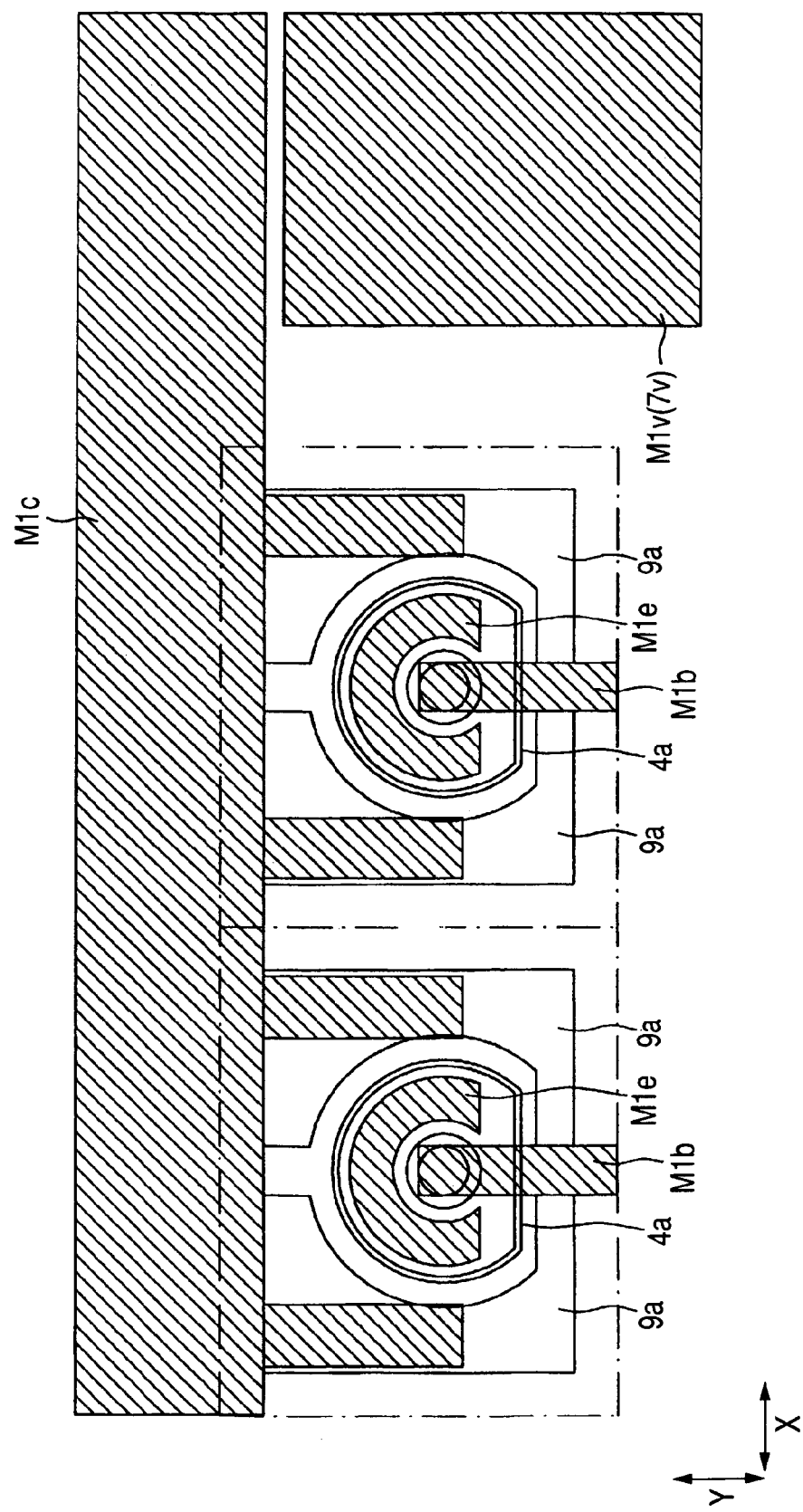
FIG. 18 is a fragmentary plan view of a substrate illustrating the manufacturing method of a semiconductor device (HBT) according to the one embodiment of the present invention.

The insulating film 13b over the emitter electrode 7, base electrode 8, and collector electrode 9a are removed to form a connecting hole. A conductive film, such as a stacked film of molybdenum (Mo), Au and Mo (which will hereinafter be called "Mo/Au/Mo film"), is deposited over the insulating film 13b, including the inside of the connecting hole. The Mo/Au/Mo film is etched to form an emitter extraction interconnect M1e, base extraction interconnect M1b and collector extraction interconnect M1c. At this time, an interconnect M1v is formed over the backside via electrode 7v. These interconnects are defined as a first-level interconnect. FIG. 18 is a fragmentary plan view of the first-level interconnect after its formation. Since the base extraction interconnect M1b is disposed over the cutout portion (20b), the base extraction interconnect M1b does not cause unevenness attributable to the collector electrode 9a.

Figure 19:
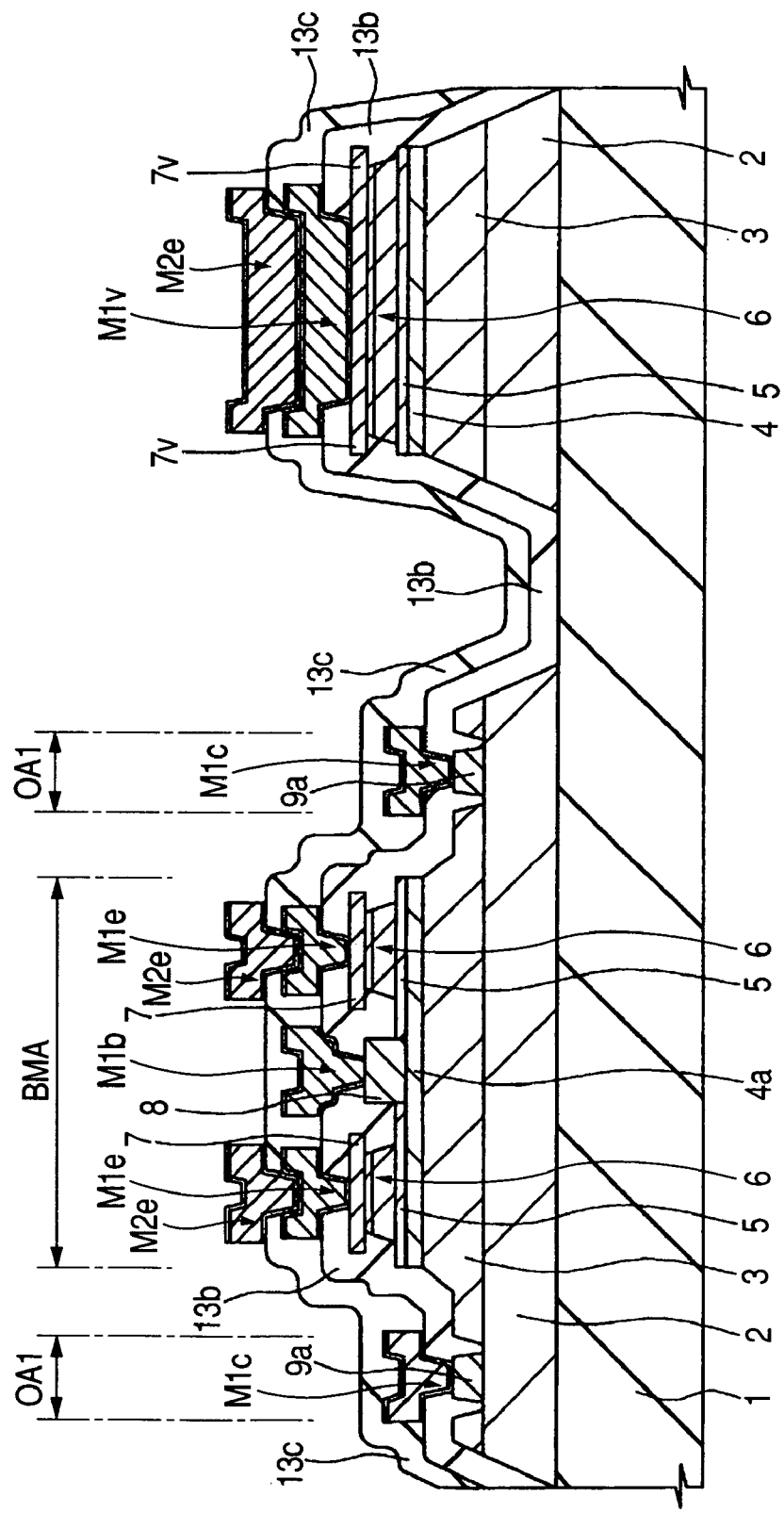
FIG. 19 is a fragmentary cross-sectional view of a substrate illustrating the manufacturing method of a semiconductor device (HBT) according to the one embodiment of the present invention.
Figure 20:
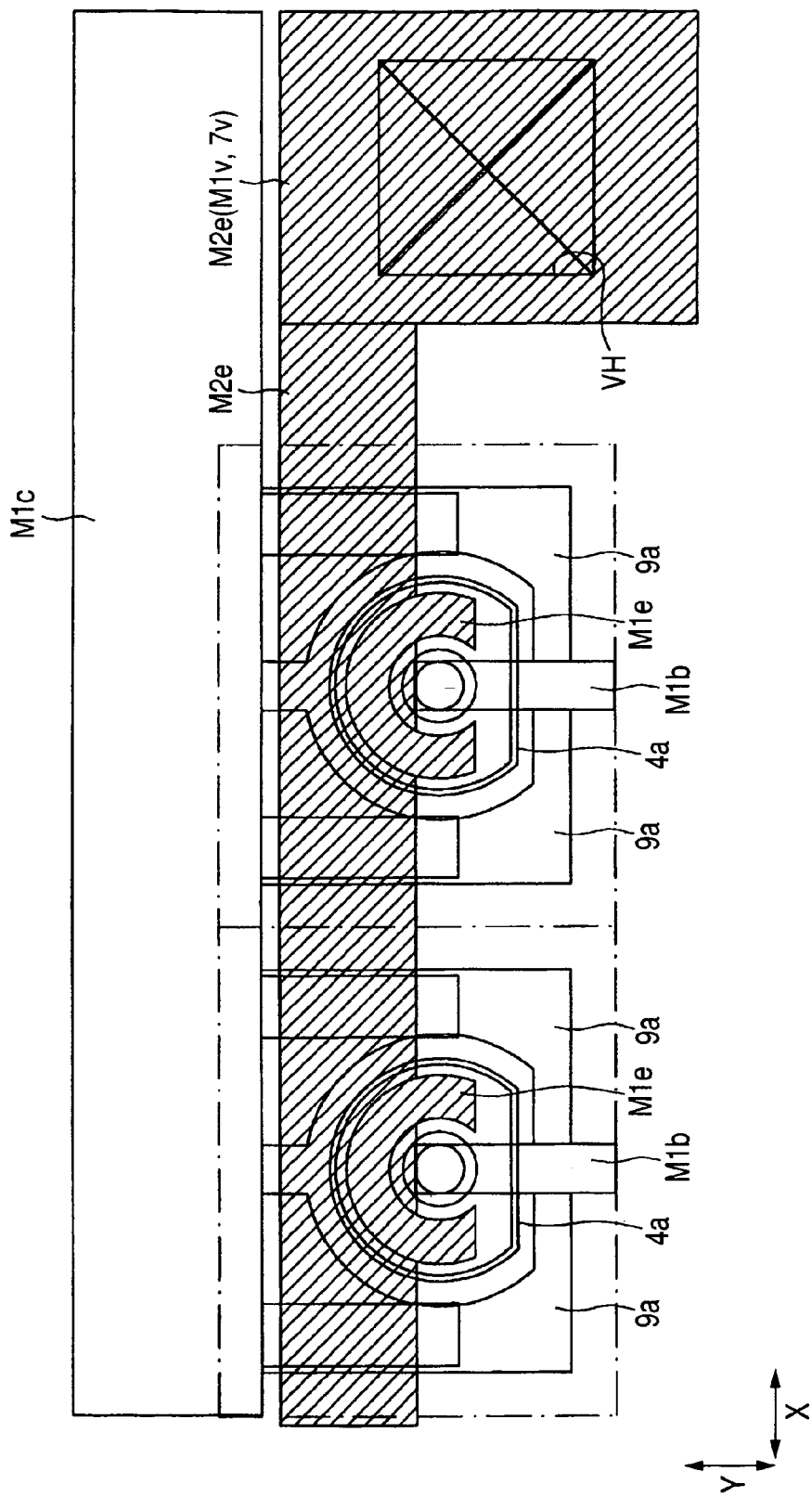
FIG. 20 is a fragmentary plan view of a substrate illustrating the manufacturing method of a semiconductor device (HBT) according to the one embodiment of the present invention.

As illustrated in FIG. 19, an insulating film 13c, such as a silicon oxide film, is deposited over the first-level interconnect (M1e, M1b, M1c, M1v), for example, by CVD. Then, the insulating film 13c over the emitter extraction interconnect M1e is removed to form a connecting hole. A conductive film, such as a Mo/Au/Mo film, is deposited over the insulating film 13c, including the inside of the connecting hole. Then, the Mo/Au/Mo film is etched to form an emitter extraction interconnect (second-level interconnect) M2e. FIGS. 20 and 21 are fragmentary plan views of the second-level interconnect after its formation. As illustrated in these diagrams, the emitter extraction interconnect M2e extends even over the backside via electrode 7v. For example, FIG. 19 corresponds to the cross-sectional view taken along a line A—A of FIG. 21. Alternatively, the emitter extraction interconnect 2e may be widened enough to cover the emitter extraction interconnect M1e. The symbol VH indicates a via hole, which will be described later.

As illustrated in FIG. 22, an insulating film 13d, such as a silicon oxide film, is deposited over the second-level interconnect (M2e).

A resistor element and capacitor element are formed in an unillustrated region over the substrate 1 as needed, and the surface of the substrate is covered with a protecting film.

The backside of the substrate 1 is then polished with the protecting film side (element formation surface) down, whereby its thickness is adjusted to 70 to 100 μm. Using an unillustrated resist film as a mask, the substrate 1, n+ type GaAs layer (sub-collector layer) 2, n type GaAs layer (collector layer) 3, p type GaAs layer (base layer) 4, n type InGaP layer (emitter layer) 5 and upper emitter layer 6 over the first-level interconnect M1v are etched to form a via hole VH. Dry etching is employed, for example, as the etching method. Deposits produced upon dry etching are removed by wet processing. For this wet processing, a mixed solution of ammonia and hydrogen peroxide is employed.

With the first-level interconnect M1v serving as an etching stopper, the backside via electrode (WSi) 7v is also etched. The Mo existing below the first-level interconnect (Mo/Au/Mo film) M1v is also etched. Accordingly, the backside via electrode (WSi) 7v and Mo exist annularly around the via hole VH. In other words, a stacked film of the backside via electrode (WSi) 7v and Mo remains on the side of the via hole VH.

A metal film, such as Au, is formed over the back side of the substrate 1, including the inside of the via hole VH, by plating, whereby a back electrode 40 is formed. This back electrode 40 is brought into contact with a portion of the Au constituting the first-level interconnect M1v, so that the contact resistance is reduced. Since the Au itself is a low resistance material, its use as an interconnect for the connection with the back electrode 40 is suitable. Alternatively, Au/Mo/WSi or Au/Pt/Ti may be used as an interconnect.

In this Embodiment, the backside via electrode 7v is formed using a material, such as WSi, which does not easily react with the n type GaAs layer or n type InGaAs layer constituting the upper emitter layer 6, so that generation of side etching upon formation of the via hole VH can be reduced. In addition, the backside via electrode 7v is formed in the same step with that for forming the electrode (emitter electrode 7, in this case), which is formed of a material which hardly reacts with the n type GaAs layer or n type InGaAs layer, constituting the upper emitter layer 6, so that the number of steps can be reduced.

Figure 26:
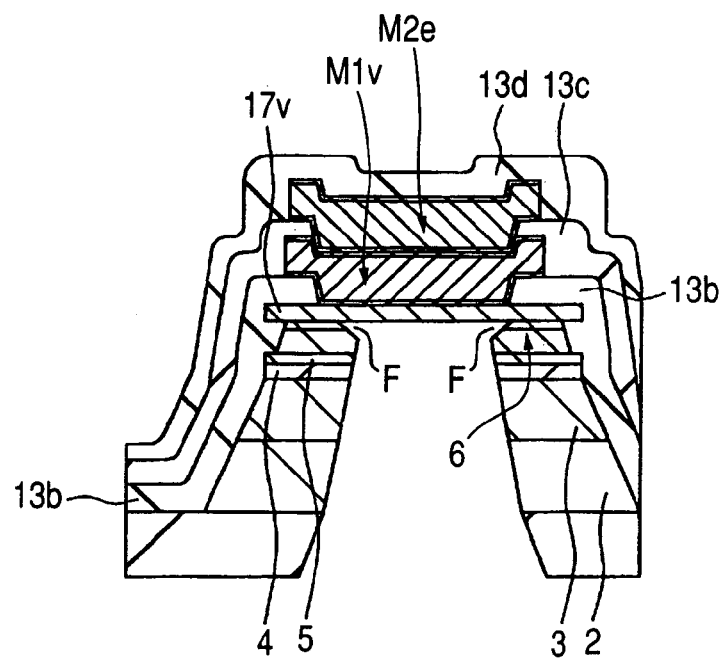
FIG. 26 is a fragmentary cross-sectional view of a substrate illustrating the manufacturing method of a semiconductor device (HBT) for explaining the advantage of the present invention.

For example, as illustrated in FIG. 26, the backside via electrode 17v may be formed in the same step with that for the collector electrode (Auge/Ni/Au). In this case, however, the n type GaAs layer or n type InGaAs layer comes in contact with the bottom AuGe layer, and a reaction layer is formed at the contact site (alloyed).

This reaction layer is apt to be etched with an etchant (for example, a mixed solution of ammonia and hydrogen peroxide) used for the wet processing, so that side etching appears on the bottom of the via hole. This side etching portion is defined as F. When the back electrode 40 is formed after that, the side etching portion F becomes hollow and the backside via electrode 17v and back electrode 40 are easy to peel.

The reaction layer between the bottom AuGe layer and the semiconductor is relatively fragile. Even when wet processing is omitted and a side etching portion is not formed, the reaction layer is not resistant to a mechanical force and the backside via electrode 17v easily peels.

Figure 27:
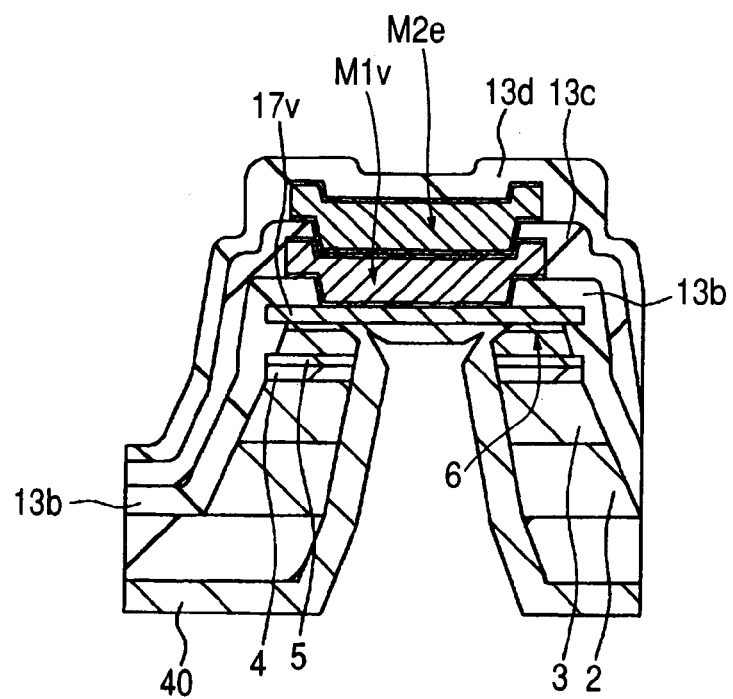
FIG. 27 is a fragmentary cross-sectional view of a substrate illustrating the manufacturing method of a semiconductor device (HBT) for explaining the advantage of the present invention.

As illustrated in FIG. 27, the back electrode 40 becomes thin at the side etching portion F, which sometimes leads to disconnection. When the back electrode 40 is thin, an increase in the electrode resistance or deterioration in electromigration resistance occurs. Thus, the reliability of the back electrode 40 lowers.

In this embodiment, on the other hand, generation of side etching can be reduced and adhesion between the backside via electrode and the semiconductor can be improved. This leads to an improvement in the reliability of the back electrode.

In this embodiment, WSi is used as a material (non-alloyed material), which hardly reacts with a compound semiconductor layer and exhibits good adhesion with a semiconductor, but a refractory metal, a nitride or silicide thereof can be used alternatively. Examples include refractory metals such as Ti, W, Ta and Mo and compounds of a refractory metal such as titanium tungsten (TiW). Nitrides of a refractory metal (for example, TiN) and silicides of a refractory metal (for example, TiSi, TaSi and MoSi) may be used as well.

When the backside via electrode 7v and the emitter electrode 7 are formed in the same step, a stacked film of Ti/Pt/Au, which has been stacked in this order, may be used. It is needless to say that the backside via electrode 7v and emitter electrode 7 are formed in different steps by using different materials.

Figure 28:
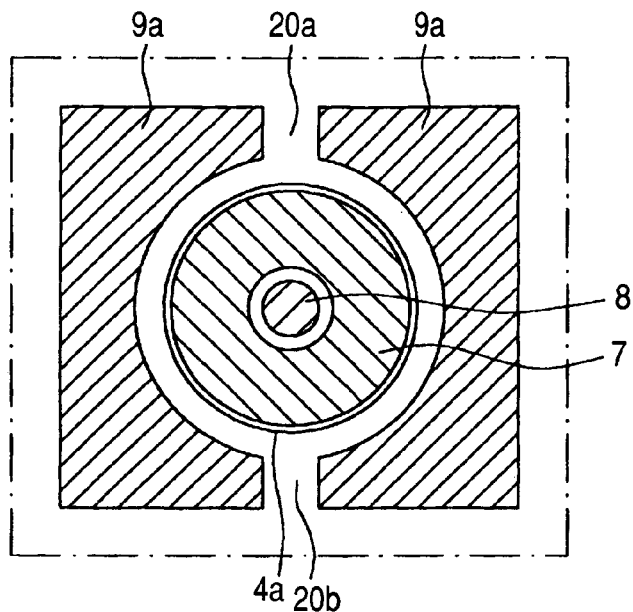
FIG. 28 is a fragmentary plan view of a substrate illustrating another semiconductor device (HBT) according to one embodiment of the present invention.

In this embodiment, a transistor having a pattern shape as described with reference to FIG. 14, has been proposed was described. However, the shape is not limited thereto, but a circular pattern, as illustrated in FIG. 28, may be adopted as well.

As described with reference FIG. 18 and FIG. 20, the resistance of the emitter electrode can be lowered by widening the contact region between the emitter extraction electrode M1e or M2e and the emitter electrode 7. For example, the sheet resistance of the interconnect is 0.04 o/□ and the sheet resistance of the emitter electrode (WSi) is 6 o/□.

At the base extraction interconnect M1b portion, however, an emitter extraction interconnect cannot be formed, and a parasitic resistance of several o is connected to the emitter layer in series, which raises the resistance of the emitter electrode 7. In order to lower the resistance of the emitter layer, it is desired to form a cutout portion on the extraction side of the base electrode, as illustrated in FIG. 14.

Figure 29:
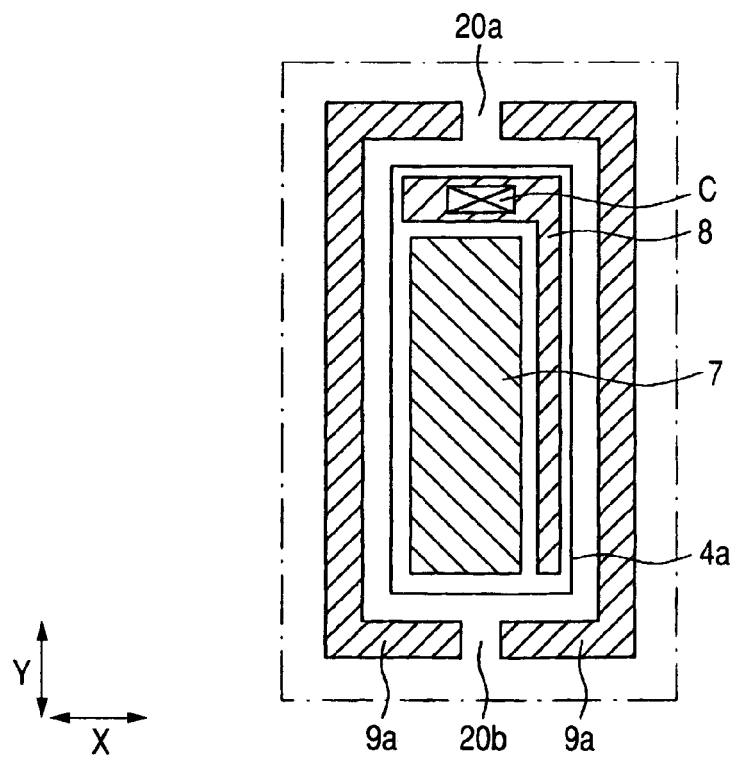
FIG. 29 is a fragmentary plan view of a substrate illustrating another semiconductor device (HBT) according to one embodiment of the present invention.

A rectangular pattern, as illustrated in FIG. 29, may be employed. For example, when a rectangular pattern as illustrated in FIG. 29 is adopted, an emitter electrode 7 and base electrode 8, each having a linear shape, are formed over the base mesa 4a, and a collector electrode 9a encompassing the base mesa 4a is composed of a pair of patterns having a portion extending in the Y direction and another portion extending in the X direction from each end of the former portion. A contact portion over the base electrode 8 is indicated by C.

In the above-described embodiment, an npn type bipolar transistor was described, but the present invention may be applied to a pnp type bipolar transistor as well. The bipolar transistor described herein is formed over a GaAs substrate, but another compound semiconductor may be used instead.

The present invention can be widely applied to a semiconductor device having an isolated pattern. The present invention is particularly suited for a bipolar transistor with an annular structure, because it tends to have an isolated pattern.

The present invention can be widely applied to semiconductor devices having a via hole for connecting a back electrode and a surface interconnect. Use of the present invention is particularly suited for a GaAs or InP substrate, because via holes tend to be formed when the substrate has a semi-insulating portion.

The HBT in the above-described embodiment has a GaAs substrate and an InGaP layer as an emitter semiconductor layer. The present invention is also suited for an HBT having a GaAs substrate and an AlGaAs (aluminum gallium arsenide) layer as an emitter semiconductor layer, because the same electrode material can be used.

The present invention is also suited for an HBT having an InP (indium phosphide) substrate, because a collector electrode can be made of an Au-containing metal layer by the lift-off method.

The invention made by the present inventors has been described specifically based on one embodiment. However, it should be borne in mind that the present invention is not limited to or by the described embodiment. It is needless to say that the present invention can be modified within an extent not departing from the scope of the present invention.

Advantages available by the representative invention, as disclosed in the present application, will next be described briefly. The present invention makes it possible to improve the properties of a bipolar transistor.

What is claimed is:

1. A method of manufacturing a semiconductor device including a hetero-junction bipolar transistor (HBT), comprising steps of:
   (a) preparing a substrate having a main surface and a back surface opposite thereto, the substrate having a first region and a second region;
   (b) forming a collector layer of the HBT over the main surface in the first region of the substrate;
   (c) forming a base layer of the HBT over the collector layer in the first region;
   (d) forming an emitter layer of the HBT over the base layer in the first region;
   (e) forming a collector electrode over the collector layer in the first region, the collector electrode being electrically connected with the collector layer;
   (f) forming a base electrode over the base layer in the first region, the base electrode being electrically connected with the base layer;
   (g) forming, in the same step, an emitter electrode over the emitter layer in the first region and a backside via electrode in the second region, the emitter electrode being electrically connected with the emitter layer;
   (h) forming a via hole from the back surface of the substrate to the backside via electrode in the second region;
   (i) forming a back electrode on the back surface of the substrate and inside the via hole, the back electrode being electrically connected with the backside via electrode; and
   (j) forming a collector extraction interconnect, a base extraction interconnect, an emitter extraction interconnect and an interconnect for the backside via electrode, each electrically connected with the collector layer, base layer, emitter layer and backside via electrode, respectively.

2. A method of manufacturing a semiconductor device according to claim 1, wherein each of the emitter electrode and backside via electrode is comprised of a refractory metal.

3. A method of manufacturing a semiconductor device according to claim 1, wherein each of the emitter electrode and backside via electrode is comprised of a nitride film of a refractory metal.

4. A method of manufacturing a semiconductor device according to claim 1, wherein each of the emitter electrode and backside via electrode is comprised of a silicide film of a refractory metal.

5. A method of manufacturing a semiconductor device according to claim 1, wherein each of the emitter electrode and backside via electrode is comprised of tungsten silicide (WSI), titanlum tungsten (TIW) or titanium (TI).

6. A method of manufacturing a semiconductor device according to claim 1, wherein each of the substrate, collector layer and base layer is comprised of gallium arsenide (GaAs); and the emitter layer is comprised of indium gallium phosphide (InGaP).

7. A method of manufacturing a semiconductor device according to claim 1, wherein each of the collector electrode and base electrode is comprised of a gold film.

8. A method of manufacturing a semiconductor device according to claim 1, wherein the step (h) includes wet processing.

* * * * *